United States Patent
Wang et al.

(10) Patent No.: US 9,626,949 B2
(45) Date of Patent: Apr. 18, 2017

(54) SYSTEM OF MODELING CHARACTERISTICS OF A MUSICAL INSTRUMENT

(71) Applicant: Positive Grid LLC, Henderson, NV (US)

(72) Inventors: Tien-Ming Wang, Tainan (TW); Yi-Fan Yeh, New Taipei (TW); Yi-Song Siao, Tainan (TW)

(73) Assignee: POSITIVE GRID LLC, Henderson, NV (US)

( * ) Notice: Subject to any disclaimer, the term of this patent is extended or adjusted under 35 U.S.C. 154(b) by 0 days.

(21) Appl. No.: 14/804,948

(22) Filed: Jul. 21, 2015

(65) Prior Publication Data

US 2017/0025111 A1  Jan. 26, 2017

(51) Int. Cl.
*G10H 7/00* (2006.01)
*H04R 1/46* (2006.01)
*H04R 3/04* (2006.01)
*H04R 29/00* (2006.01)

(52) U.S. Cl.
CPC .............. *G10H 7/002* (2013.01); *H04R 1/46* (2013.01); *H04R 3/04* (2013.01); *H04R 29/008* (2013.01)

(58) Field of Classification Search
CPC . G10H 7/002; H04R 1/46; H04R 3/04; H04R 29/008
USPC .................................................. 84/645, 723
See application file for complete search history.

(56) References Cited

U.S. PATENT DOCUMENTS

| | | | | |
|---|---|---|---|---|
| 6,320,113 B1* | 11/2001 | Griffin | ...................... | G10D 3/00 84/738 |
| 8,796,530 B2* | 8/2014 | Kemper | ................... | G10H 1/06 84/616 |
| 9,099,069 B2* | 8/2015 | Shinoda | ................. | G10H 1/125 |
| 9,424,824 B2* | 8/2016 | Webman | ................. | G10H 3/18 |
| 2007/0227344 A1* | 10/2007 | Ryle | ........................ | G10H 1/053 84/723 |
| 2009/0064853 A1* | 3/2009 | Gillette | .................. | G10H 3/185 84/725 |
| 2014/0033900 A1* | 2/2014 | Chapman | ............. | G10H 1/0083 84/609 |
| 2014/0216235 A1* | 8/2014 | Alt | ......................... | G10H 3/186 84/726 |
| 2014/0260906 A1* | 9/2014 | Welch | .................... | G10H 3/182 84/603 |

* cited by examiner

*Primary Examiner* — Jeffrey Donels
(74) *Attorney, Agent, or Firm* — Haynes and Boone, LLP

(57) ABSTRACT

A system for modifying an audio signal comprises a computer including a first digital signal processor (DSP). The first DSP includes a first module and a second module. The first module is coupled to the interface to provide a musical instrument with a set of testing input signals and obtain a set of testing output signals from the musical instrument via the interface. The second module is configured to perform functions including: analyzing the set of testing output signals to obtain a set of parameters, constructing an acoustic transducer to model characteristics of the musical instrument based on the set of parameters, and receiving the audio signal to modify the audio signal using the acoustic transducer, wherein the first DSP module obtains the set of parameters at least by identifying occurrences when an output level state determined at least based on the set of testing output signals significantly changes.

20 Claims, 18 Drawing Sheets

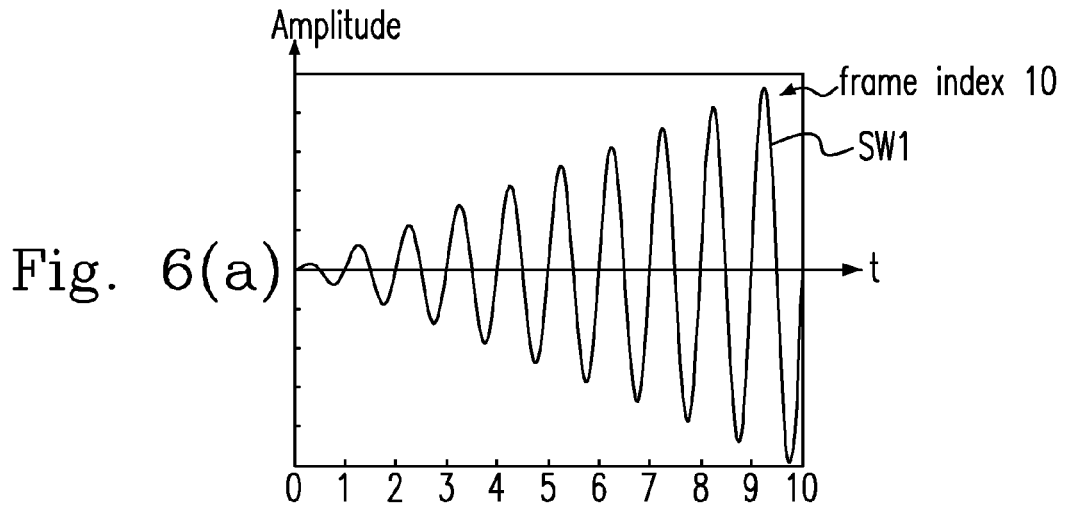
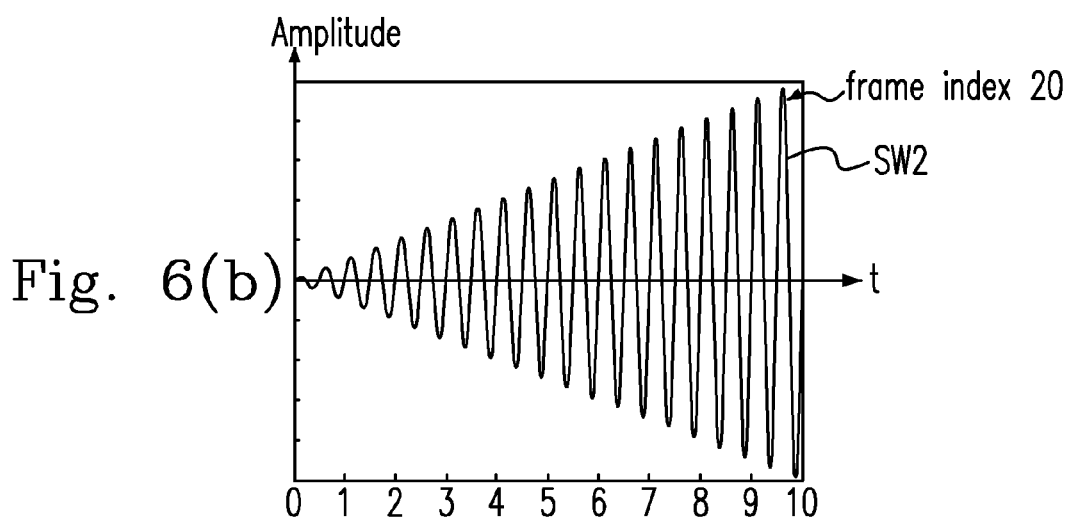
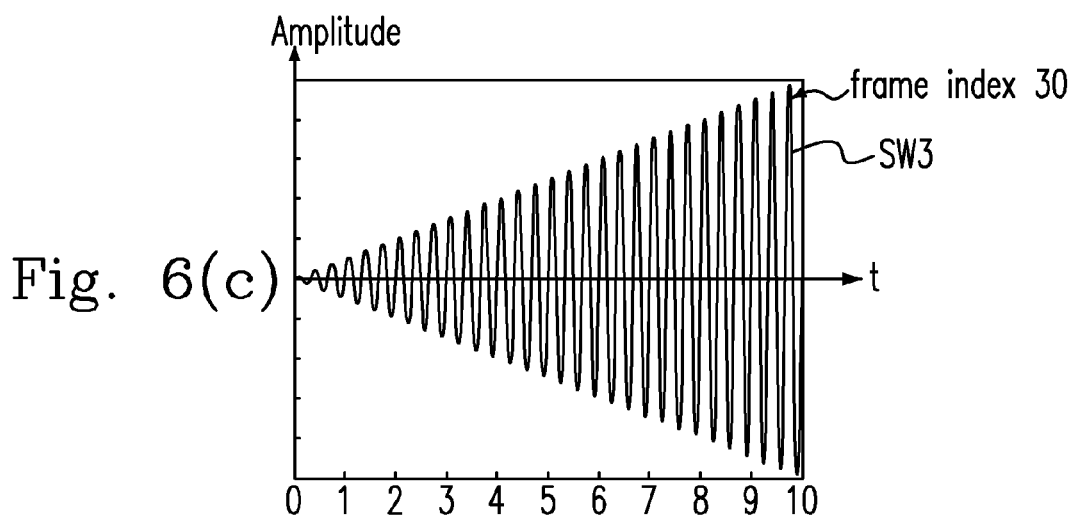

SYSTEM OF MODELING CHARACTERISTICS OF A MUSICAL INSTRUMENT

TECHNICAL FIELD

Embodiments of the present disclosure are related to method of modeling a characteristic of a musical instrument and system using the same.

BACKGROUND

In computer technology, a wavetable is a table of stored sound waves that are digitized samples of actual recorded sound. A wavetable is stored in read-only memory (ROM) on a sound card chip but it can also be supplemented with software. Originally, computer sounds (digital versions of analog waveforms) were generated through frequency modulation (FM). Pre-storing sound waveforms in a lookup table improved quality and throughput, but it requires large memory space to store.

Another method for creating instrumental sound is physical sound modeling. Three basic types of models are useful nowadays for musical sound generation: instrument models, spectrum models and abstract models. Instrument models attempt to characterize sound parameters at their mechanical/acoustic source, such as different kinds of timbre of flute, violin, piano, guitar and so on.

To synthesize sounds, we generally want to model an entire timbre family. This can be done by analyzing single tone and note transition performed on the instrument, and building a database that characterizes the whole instrument or any desired timbre family, from which new sounds are synthesize. In the case of the sound processing application, the goal is to manipulate any given sound, that is, not being to restrict to isolated tones and not requiring a previously built database of analyzed data. Thus, the large memory space is not necessarily required.

Another method for creating timbre is to model characteristic of musical instrument in which a reference timbre feeds. Please refer to FIG. 1, which shows a musical instrument with acoustic transducer in the prior art. The musical instrument 16 includes a sound transducer/filter 11, a processor 8, a reference profile memory 7, an adjustable amplifier and a difference former 14. A reference sound is generated directly by a sound generator 10 of a musical instrument 9 or with the use of a loudspeaker 5 by a reference instrument 2, which is made up of a sound generator 3 and a reference sound transducer 4. Then, this reference sound is picked up by a microphone 6. The microphone 6 is connected to a reference memory 7, which makes it possible to store a reference profile 1. The reference memory 7 is connected to a signal processor 8, which supports in particular a statistical evaluation of the sound impression picked up by the microphone 6.

The reference profile 1 can be acquired, for example, by recording a sufficiently long musical performance on a specific reference instrument 2 and by using the signal processor 8 to evaluate it with respect to the characteristic frequency response of the reference instrument 2 or its reference sound transducer 4.

In FIG. 1, the sound generator 10 is connected to a sound transducer 11. The sound transducer 11 generates an acoustic signal, which is sent directly or by the use of a loudspeaker 12 to an environment. The current characteristic profile 13 of the sound transducer 11 is sent to a difference former 14, which evaluates the reference profile 1 as a second input variable. The output signal produced by the difference former 14 is sent under consideration of an amplification 15 to the sound transducer 11 and parameterizes its physical sound. It is thus possible to bring the sound impression of the transducer 11 very close to the sound impression of the reference instrument 2.

Although the characteristic of the reference sound transducer 4 is evaluated, it is also expected that a précised method to estimate frequency response of the entire musical instrument including the filter 11, the amplification 15 and other stage.

SUMMARY OF EXEMPLARY EMBODIMENTS

In accordance with one embodiment of the present disclosure, a system for modifying an audio signal is disclosed. The system for modifying an audio signal comprises an interface and a computer. The computer includes a first digital signal processor (DSP) and a network module. The first DSP includes a first module and a second module. The interface is configured to interact with a musical instrument. The first module is coupled to the interface to provide the musical instrument with a set of testing input signals and obtain a set of testing output signals from the musical instrument via the interface. The second module is configured to perform functions including: analyzing the set of testing output signals, in at least one of a time domain, a frequency domain and a combination thereof, to obtain a set of parameters, constructing an acoustic transducer to model characteristics of the musical instrument based on the set of parameters, and receiving the audio signal to modify the audio signal using the acoustic transducer, wherein the first DSP module obtains the set of parameters at least by identifying occurrences when an output level state determined at least based on the set of testing output signals in at least one of the frequency domain and the time domain significantly changes. The network module is coupled to the first DSP module to uplink the set of parameters to a cloud end to share with a client end.

In accordance with one embodiment of the present disclosure, a system for modifying an audio signal is disclosed. A system for modifying an audio signal comprises an interface and a mobile device. The mobile device includes a first digital signal processor (DSP) and a network module. The first DSP includes a first module and a second module. The interface is configured to interact with a musical instrument. The first module is coupled to the interface to provide the musical instrument with a set of testing input signals and obtain a set of testing output signals from the musical instrument via the interface. The second module is configured to perform functions including: analyzing the set of testing output signals, in at least one of a time domain, a frequency domain and a combination thereof, to obtain a set of parameters, constructing an acoustic transducer to model a characteristic of the musical instrument based on the set of parameters, and receiving the audio signal to modify the audio signal by the acoustic transducer, wherein the first DSP module obtains the set of parameters at least by identifying occurrences when an output level state determined at least based on the set of testing output signals in at least one of the frequency domain and the time domain significantly changes. The network module coupled to the first DSP module to uplink the set of parameters to a cloud end to share with a client end.

In accordance with one embodiment of the present disclosure, a system for modifying an audio signal is disclosed. The system for modifying an audio signal comprises an interface and a host. The host including a DSP module includes a first module and a second module. The first module is coupled to the interface to provide the musical instrument with a set of testing input signals and obtain a set of testing output signals from the musical instrument via the interface. The second module is configured to perform functions including: analyzing the set of testing output signals to obtain a set of parameters, constructing an acoustic transducer to model characteristics of the musical instrument based on the set of parameters and receiving the audio signal to modify the audio signal using the acoustic transducer, wherein the DSP module obtains the set of parameters at least by identifying occurrences when an output level state determined at least based on the set of testing output signals in at least one of a frequency domain and a time domain significantly changes.

The above embodiments and advantages of the present invention will become more readily apparent to those ordinarily skilled in the art after reviewing the following detailed descriptions and accompanying drawings.

BRIEF DESCRIPTION OF THE DRAWINGS

FIG. 6(a) shows the sweep signals according to the preferred embodiment of the present disclosure;

FIG. 6(b) shows the sweep signals according to the preferred embodiment of the present disclosure;

FIG. 6(c) shows the sweep signals according to the preferred embodiment of the present disclosure;

DETAILED DESCRIPTION OF THE PREFERRED EMBODIMENTS

Figure 1:
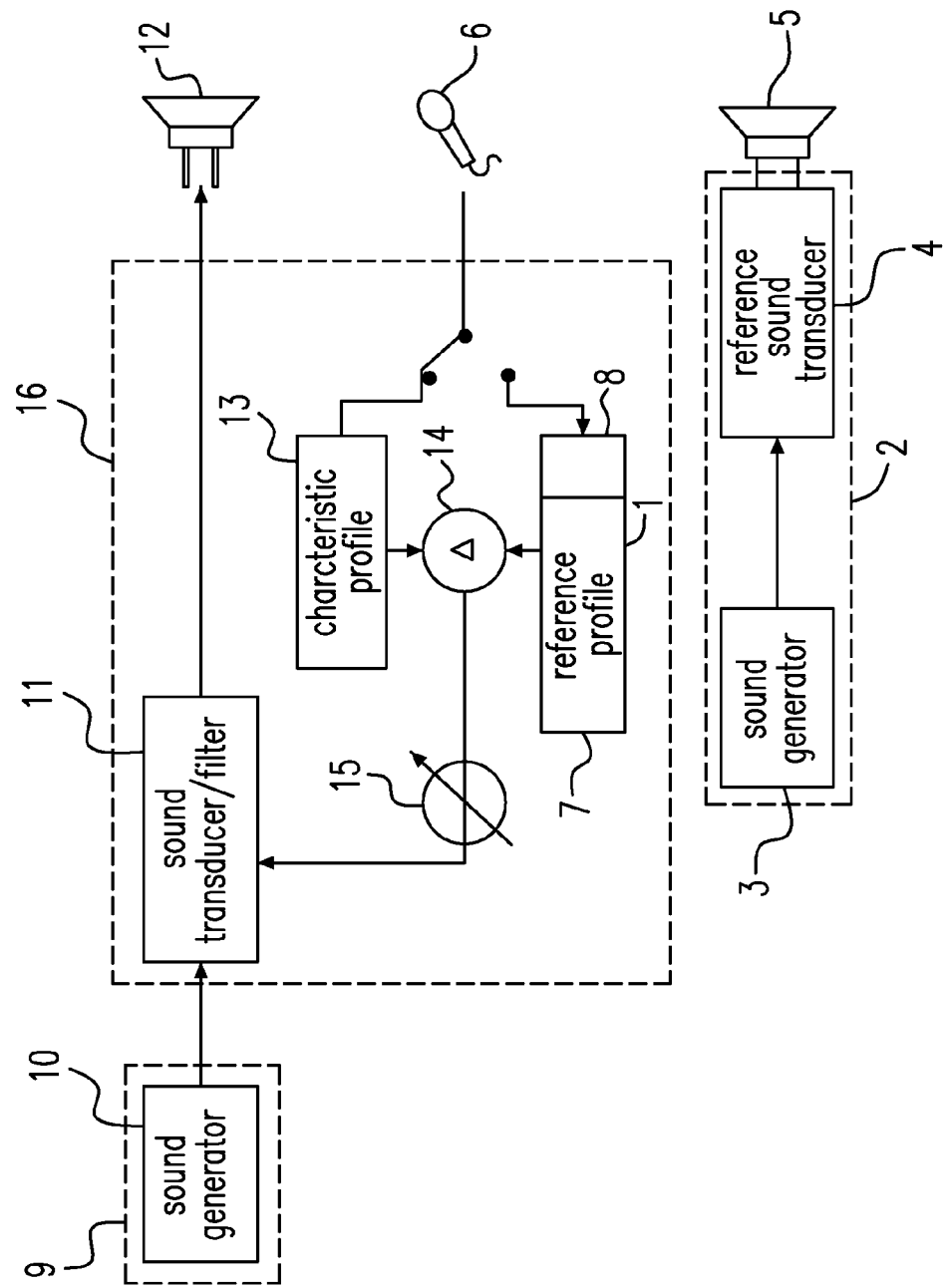
FIG. 1 shows a musical instrument with acoustic transducer in the prior art.
Figure 2:
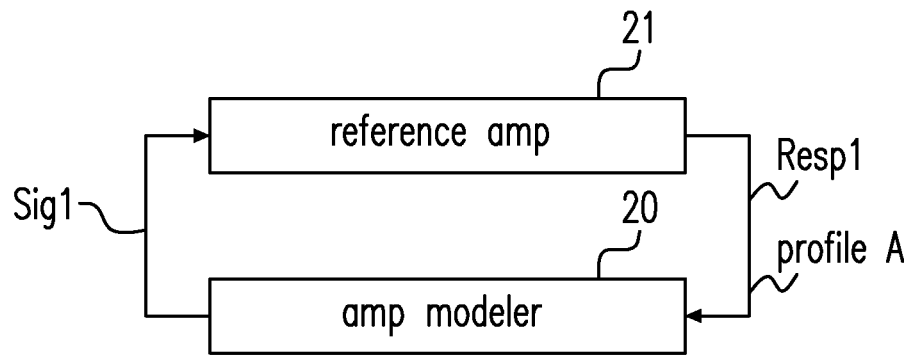
FIG. 2 shows an amp modeler analyzing characteristic of reference amp according to a preferred embodiment of the present disclosure.

Please refer to FIG. 2, which shows an amp modeler 20 analyzing the characteristic of a reference amp 21 according to a preferred embodiment of the present disclosure. In FIG. 2, the amp modeler 20 includes a test generator (not shown) generating a testing input signal Sig1, in which the reference amp 21 is fed. The reference amp 21, in response to the testing input signal Sig1, outputs a testing output signal Resp1, which is used to analyze the characteristic of the reference amp 21. The amp throughout the present disclosure can include, but is not limited to, an amp for a flute, violin, piano or guitar. The amp throughout the present disclosure can be an analog amp, digital amp or any combination thereof. The amp throughout the present disclosure can take the form of software, firmware, hardware or any combination thereof.

The amp modeler 20 may be implemented by a computer with analysis software, a mobile device or DSP (digital signal processing) hardware. After analyzing the characteristic of the reference amp 21, the amp modeler 20 can model a new characteristic originated from the reference amp 21, and can create a new timbre by feeding the amp modeler 20 with the same source of the reference amp 21.

Figure 3:
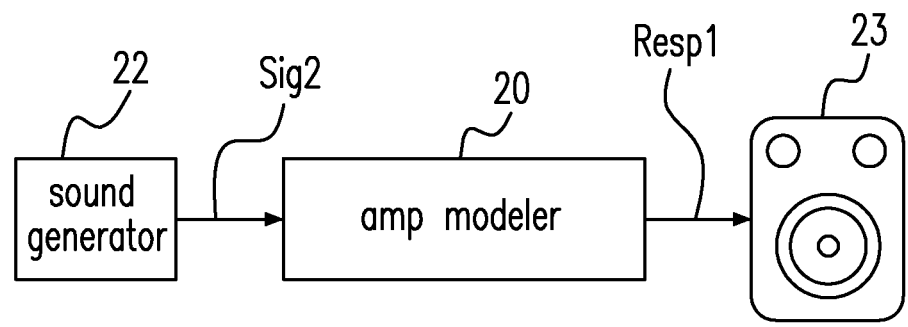
FIG. 3 shows the amp modeler to synthesis the new timbre according the preferred embodiment of the present disclosure.

Please refer to FIG. 3, which shows how the amp modeler 20 synthesizes the new timbre according the preferred embodiment of the present disclosure. The characteristic of the reference amp 21 is matched or modeled by the amp modeler 20, which can filter a sound signal Sig2 to create a testing output signal Resp2 having a characteristic of the new timbre. The testing output signal Resp2 is then fed into a speaker device 23 to create the sound. For example, the testing input signal Sig1 is input to a reference guitar amp to generate the testing output signal Resp1, and the amp modeler 20 analyzes it to obtain the characteristic of the reference amp 21. Then the guitar as a sound generator 22 generates the sound signal Sig2, and the amp modeler 20 filters the sound signal Sig2 to create the new timbre, which has a distortion effect on the original timbre of the guitar. Although the guitar is described as the sound generator in this embodiment, the sound generator throughout the present disclosure can include, but is not limited to, a flute, violin, piano or guitar.

Figure 4:
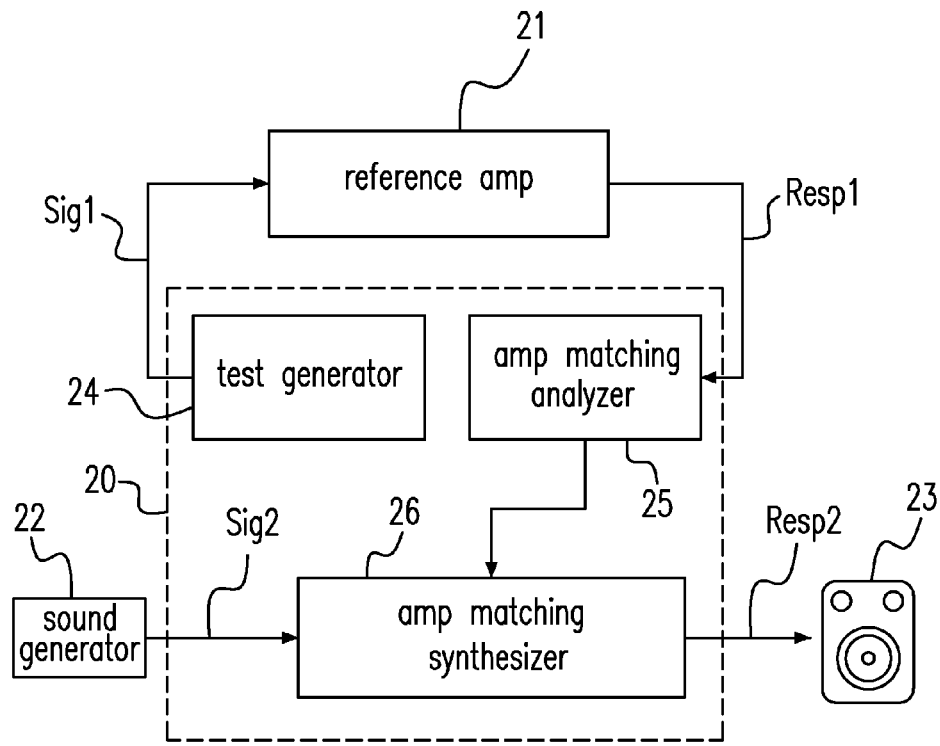
FIG. 4 shows details of the amp modeler 20 according to the preferred embodiment of the present disclosure.

Please refer to FIG. 4, which shows details of the amp modeler 20 according to the preferred embodiment of the present disclosure. The amp modeler 20 may be implemented by software, firmware hardware, or any combination thereof, and it may include a test generator 24, an amp matching analyzer 25 and an amp matching synthesizer 26. The test generator 24 can create the testing input signal Sig1 such as a white noise signal. In some embodiments, the amp modeler 20 is implemented by a computer with analysis software. The work of the amp matching analyzer 25 and the amp matching synthesizer 26 can be done by a processor, a memory, and installed software. In FIG. 4, the amp matching analyzer 25 records parameters obtained from analyzing the reference amp 21, and the amp matching synthesizer 26 utilizes those parameters to filter the sound from the sound generator 22. The reference amp 21 which the amp modeler 20 analyzes can be generally divided into at least a pre-amp stage 211, an amplification stage 212 and a post-amp stage 213. (See FIG. 5 below). Therefore, the parameters which the amp modeler 20 analyzes include frequency response characteristics of the pre-amp stage 211, the amplification stage 212, the post-amp stage 213 and so forth.

Figure 5:
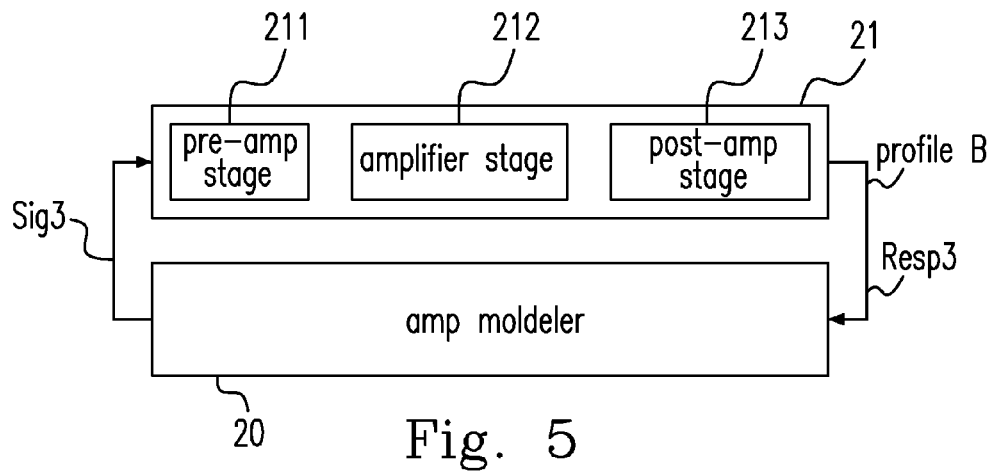
FIG. 5 shows details of the reference amp 21 according to the preferred embodiment of the present disclosure.

Please refer to FIG. 5, which shows details of the reference amp 21 according to the preferred embodiment of the present disclosure. The reference amp 21 can be characterized as several blocks according to an analysis of the amp modeler 20. For example, the reference amp 21 can be characterized as at least a pre-amp stage 211, an amplification stage 212 and a post-amp stage 213.

In some embodiments, the pre-amp stage 211 is a filter having a type of low pass filter, high pass filter, band pass filter, notch filter and the like. The pre-amp stage 211 dominates which kind of the timbre is created, and the response of the pre-amp stage 211 can determine the quality of the timbre, that is, model, shape the timbre or filter unwanted components from the timbre.

In some embodiments, the post-amp stage 213 is an equalizer having many band pass filters in frequency ranges such as low, medium and high frequency ranged from about 20 Hz~10000 Hz that creatures may hear. This won't affect the energy distribution of the frequency response characteristic of the pre-amp stage 211 if the equalizer has even energy distribution across the respective frequency ranges.

In some embodiments, the amplification stage 212 merely affects the energy or amplitude of the frequency response characteristic of the pre-amp stage 211, but this won't affect the energy distribution or shape of the frequency response characteristic of the pre-amp stage 211.

Please refer to FIGS. 2 and 5, in some case that the reference amp 21 is in linear region, assuming that the reference impulse response characteristic of the reference amp 21 at time n is h(n) of Discrete Fourier Transform (DFT), the frequency response characteristic in each block of the reference amp 21 can be analyzed by utilizing the following model equation (1):

$$H(k)=H_{pre\text{-}amp}(k)*H_{amp}(k) \times H_{post\text{-}amp}(k) \qquad (1)$$

wherein * means mathematical operation of convolution, $H_{pre\text{-}amp}(k)$ is the frequency response characteristic of the pre-amp stage 211, $H_{amp}(k)$ is the frequency response characteristic of the amplification stage 212, $H_{post\text{-}amp}(k)$ is the frequency response characteristic of the post-amp stage 213, H(k) is the reference frequency response characteristic of the reference amp 21, and k is the frequency index. In addition, the frequency response characteristics $H_{pre\text{-}amp}(k)$, $H_{amp}(k)$, and $H_{post\text{-}amp}(k)$ corresponds to the impulse responses characteristics $h_{pre\text{-}amp}(n)$, $h_{amp}(n)$, and $h_{post\text{-}amp}(n)$, so that:

$$h(n)=h_{pre\text{-}amp}(n) \times h_{amp}(n) * h_{post\text{-}amp}(n) \qquad (2)$$

In some case that the reference amp 21 is in non-linear region, the impulse response characteristic of the amplifier stage 212 is a function of h_pre-amp(n), and can be analyzed by utilizing the following model equation (3):

$$h\_pre\text{-}NL(n)=h\_amp(h\_pre\text{-}amp(n)) \qquad (3)$$

wherein h_pre-NL(n) represents non-linear impulse response characteristic of the amplifier stage 212.

Then, the impulse response characteristic of the post-amp stage 213 equals to a convolution of h_pre-NL(n) and the impulse response characteristic of the post-amp stage 213, and it can be analyzed by utilizing the following model equation (4):

$$h(n)=h\_pre\text{-}NL(n)*h\_post\text{-}amp(n) \qquad (4)$$

Therefore, the impulse response characteristic h(n) of the post-amp stage 213 can be transformed to H(k) by FFT as following:

$$H(k)=H\_pre\text{-}NL(k) \times H\_post\text{-}amp(k) \qquad (5)$$

Please refer to FIG. 2. When the testing input signal Sig1 is a white noise signal which has even energy distribution in the frequency domain and has a relatively low input level while the reference amp 21 remains in a linear region, the reference amp 21 outputs the testing output signal Resp1 having a frequency response of profile A. The frequency response of profile A is theoretically proportional to a product of the frequency response characteristic of the pre-amp stage 211 and the frequency response characteristic of the post-amp stage 213 as follows:

$$P_A(k)=\alpha \times H_{pre\text{-}amp}(k) \times H_{post\text{-}amp}(k) \qquad (6)$$

wherein $P_A(k)$ is the frequency response of profile A, and $\alpha$ is a constant. The equation (6) can be applied to the situation when the reference amp 21 is in a non-linear region, i.e., the equation (5) can be generalized to the equation (6). If we assume that the frequency response of the white noise signal Sig1 is and $S_1$ (with the presumption of even energy distribution in the frequency domain) respectively, and the frequency response characteristic of the amplification stage 212 is $H_{amp}(k)=\delta(k)$, wherein $\delta(k)$ is a unit impulse with the following definition:

$$\delta(k) = \begin{cases} 0, & k \neq 0 \\ 1, & k = 0. \end{cases} \qquad (7)$$

The reason we obtain equation (3) is that when the input level of the white noise signal Sig1 is relatively low so that the amplification stage 212 maintains the reference amp 21 in a linear region, the amplification stage 212 will have a constant gain value (or even energy distribution) in the time domain. Thus, amplification stage 212 will equivalently have a unit impulse frequency response and only affect the amplitude, rather than the energy distribution or shape, of the frequency response of the reference amp 21. Therefore, $H_{amp}(k)$ can be reduced to a constant gain $H_{amp}$ so that α is proportional to the product of $S_1$ and $H_{amp}$, and is a constant.

The amp modeler 20 can obtain the frequency response of profile A by analyzing it. Therefore, if the frequency response characteristic of the pre-amp stage 211 is obtained, the frequency response characteristic of the post-amp 213 can be obtained through the calculation in equation 1. The amplitude of the frequency response characteristics of the pre-amp stage 211 and the post-amp stage 213 can be normalized when we are only concerned about the shape of the frequency response characteristics.

Figure 23:
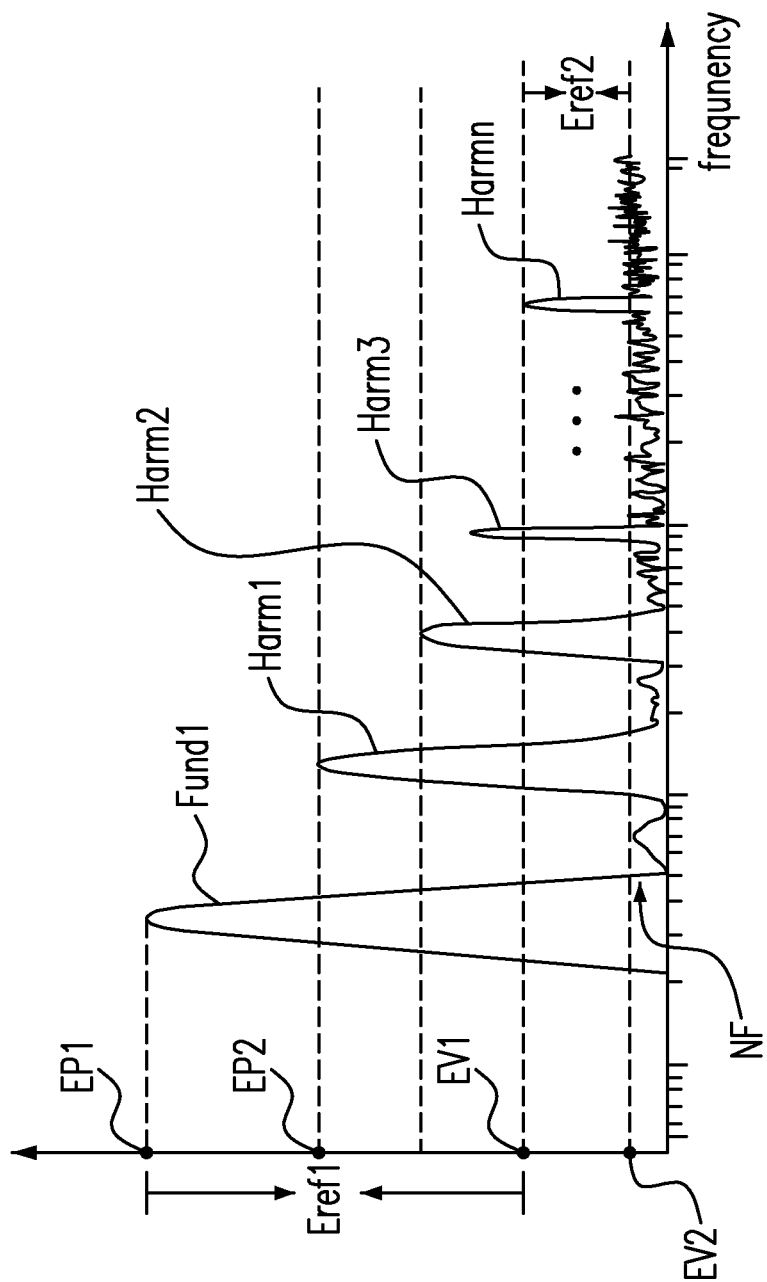
FIG. 23 shows fundamental frequency and harmonics of the sine signal in frequency domain according to the preferred embodiment of the present disclosure.

Please refer to FIG. 5. When the testing input signal Sig3 is a sweep signal which is increasing either in frequency or input level, the reference amp 21 outputs the testing output signal Resp3 having a frequency response of profile B. Here noticeably, the amplification stage 212 will begin to affect the distribution or shape of the frequency response of profile B because the sweep signal Sig3 will generate certain input level which, with the effect of the pre-amp stage 211 included, cannot strictly restrict the reference amp 21 in the linear region. However, the frequency response of the profile B can imply and map the frequency response characteristic of the pre-amp filter 211. A sequence of a test sweep signals is preferably used to obtain the frequency responses of profile B. Regardless of the linear effect from the post-amp stage 213, the frequency responses of profile B contain overtones only when the resulting amplitude of the impulse response from convoluting the testing input signal Sig3 and the impulse response characteristic of the pre-amp stage 211 falls into the limitation region of the reference amp 21 (an example of overtones is shown in FIG. 23 and relevant descriptions in the present disclosure).

Specifically, the sweep signal can be regarded as having several sinusoidal signals each lasting for a short-time frame, which affords the benefit to approximate the frequency response characteristic of the pre-amp stage 211 by applying overtone detection on each frame. For an example, if a short-time frame of the sinusoidal signal is regarded as a cosine function $A \times \cos(2\pi nl/N)$, A is the input level of the sinusoidal signal, l is the frequency shift component of the sinusoidal signal, n is a natural number, and N is the number of sampling points. Profile B may theoretically satisfy the following equation:

$$P_B(k) = \frac{A}{2}[\delta(k-l) + \delta(k+l)] \times H_{pre-amp}(k) * H_{amp}(k) \times H_{post-amp}(k) \quad (8)$$

wherein $P_B(k)$ is the frequency response of profile B, and $\delta(k-l)$ and $\delta(k+l)$ are frequency-shifted unit impulses with the following general definition:

$$\delta(k-m) = \begin{cases} 0, & k \neq m \\ 1, & k = m \end{cases} \quad (9)$$

When the resulting amplitude of the impulse response from convoluting the sinusoidal signal and the impulse response characteristic of the pre-amp stage 211 still falls within the linear region of the reference amp 21, the profile B can be reduced to the following equation:

$$P_B(k) = \beta \times \delta(k-l) + \gamma \times \delta(k+l) \quad (10)$$

wherein β and γ are constant values. The reason we use equation (10) is that when the reference amp 21 is maintained in a linear region, the frequency response characteristic of the amplification stage 212 can be described as $H_{amp}(k) = \delta(k)$, so the amplification stage 212 will not affect the shape of the overall frequency response $P_B(k)$ and can be reduced to a constant gain $H_{amp}$. In addition, the $\delta(k-l)$ and $\delta(k+l)$ are merely sampling the frequency components of $H_{pre-amp}(k)$ and $H_{post-amp}(k)$ at 1 and −1 components, and reduce $H_{pre-amp}(k)$ and $H_{post-amp}(k)$ to constants $H_{pre-amp}(1)$, $H_{pre-amp}(-1)$, $H_{post-amp}(1)$ and $H_{post-amp}(-1)$ respectively. Therefore, β is proportional to the product of A, $H_{pre-amp}(1)$, $H_{amp}$ and $H_{post-amp}(1)$, and is a constant; γ is proportional to the product of A, $H_{pre-amp}(-1)$, $H_{amp}$ and $H_{post-amp}(-1)$, and is a constant, as well.

In view of equation (10), we know that when the reference amp 21 is maintained within the linear region, there will be no overtone because the overall frequency response $P_B(k)$ is merely two impulses.

In contrast, when a resulting impulse response of convoluting the short-time frame of the sinusoidal signal and the impulse response characteristic of the pre-amp stage 211 falls into the non-linearity region of the reference amp 21, the ideal case of equation (10) will not happen. The reason is because the impulse response characteristic of the amplification stage 212, $h_{amp}(n)$, will not be a constant gain value (or even energy distribution) in the time domain. Therefore, when the amp matching analyzer 25 converts the resulting impulse response to a resulting frequency response, the resulting frequency response will contain overtones which can be regarded as a sign that the resulting impulse response has an amplitude that falls into a non-linearity region of the reference amp 21.

Please refer to FIGS. 6(a), 6(b) and 6(c), which show the sweep signals according to the preferred embodiment of the present disclosure. The horizontal axis represents time, and the vertical axis represents the amplitude of the sweep signals. In some embodiments, three sweep signals are sinusoidal signals, the first sweep signal SW1 has a frame index 10 indicating a first fixed frequency, the second sweep signal SW2 has a frame index 20 indicating a second fixed frequency, the third sweep signal SW3 has a frame index 30 indicating a third fixed frequency, and so on. The amplitudes in the three sweep signals increases at the same speed. The increasing speed of the amplitude can be a linear increase, exponential increase or any other increase form. In FIGS. 6(a), 6(b) and 6(c), each of the three sweep signals has constant frequency, but their amplitudes are variable, and can be called an amplitude modulation signal. They can be represented as the following equation:

$$y(t) = A(t) \times \sin(2\pi f_0 t) \quad (11)$$

wherein $f_0$ is a fundamental frequency or first order harmonic of each amplitude modulation signal, and A(t) is a variable amplitude value of each amplitude modulation signal at time t.

Figure 6D:
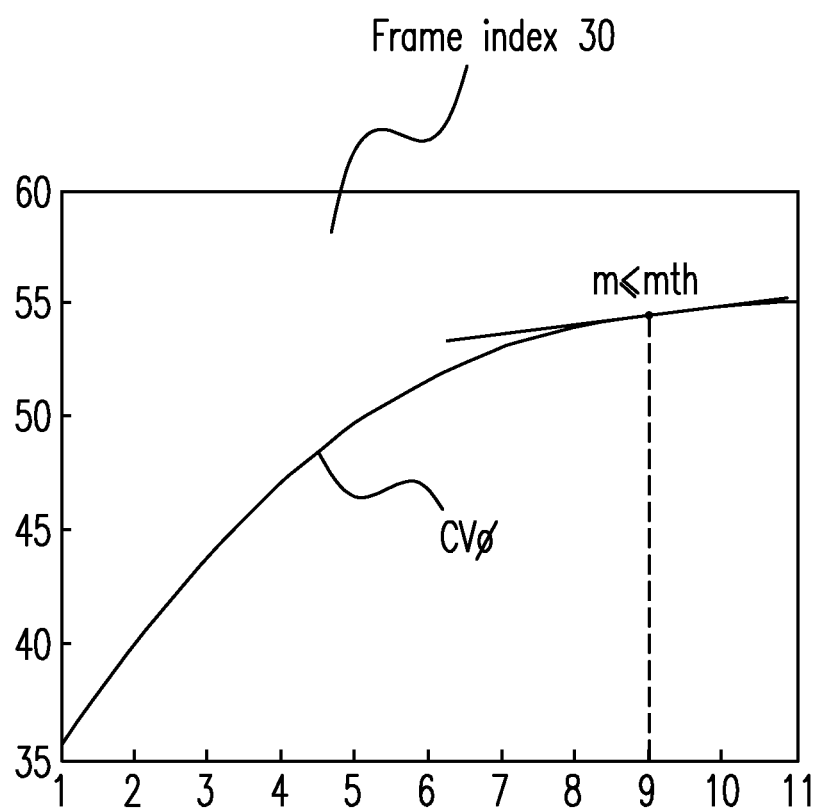
FIG. 6(d) shows diagram of the main lobe level at a predetermined fundamental frequency of the testing output signal Resp3 versus the input level of the amplitude modulation signal at the predetermined fundamental frequency.

Please refer to FIG. 6(d), which shows a shows diagram of the main lobe level (e.g., amplitude or energy level in frequency domain) at a predetermined fundamental frequency (for example, the frame index 30 in an experiment) of the testing output signal Resp3 versus the input level of the amplitude modulation signal at the predetermined fundamental frequency. The horizontal axis represents an input level of the amplitude modulation signal in FIG. 6(c), and the vertical represents a main lobe level of the testing output signal Resp3 in FIG. 5. In FIG. 6(d), it indicates that the change rate of the main lobe level of the testing output signal Resp3 begins to slow down at about 9 unit input level, i.e., the main lobe level is getting saturated or distorted, and the reference amp 21 enters the non-linear region. It can be imagined that a part of the energy of the testing output signal Resp3 is leaking to side lobe, and some energy peaks will appear at higher order harmonics. The slope m of the curve CV0 in FIG. 6(d) indicates the change rate of the main lobe level at the fundamental frequency. The curve CV0 has varying slopes at different input levels, and whether the input level makes the reference amp 21 enter into the non-linear region may be judged from the varied slope m. When the varied slope m is equal to or below a predetermined threshold slope $m_{th}$, it means that the reference amp 21 (or a non-linear system) enters into the non-linear region. The other data of main lobe levels of the testing output signal Resp3 versus the input levels of the amplitude modulation signals at other fundamental frequencies, such as frequency index 10 or 20, can also be obtained to estimate the input level which makes the reference amp 21 enters into the non-linear region at a corresponding fundamental frequency. Each fundamental frequency may have different timing point when the reference amp 21 enters into the non-linear region under the influence of the pre-amp stage 211 In addition, the smallest input level which makes the reference amp 21 enter into the non-linear region can be used to define the breakup value.

It was proved (at least by the experimental data) that in comparison with using the frequency modulation sweep signal, using the amplitude modulation signal can obtain a more noise-robust data of main lobe level of the testing output signal Resp3 versus the input level of the amplitude modulation signal. That is, the variation of the slope m of the curve CV0 depicted by applying the amplitude modulation signal will be smoother than that depicted by applying the frequency modulation signal. Therefore, the amplitude modulation signal may be preferable in some situations to improve the reliability and accuracy of the characteristic analysis and estimation.

Figure 7:
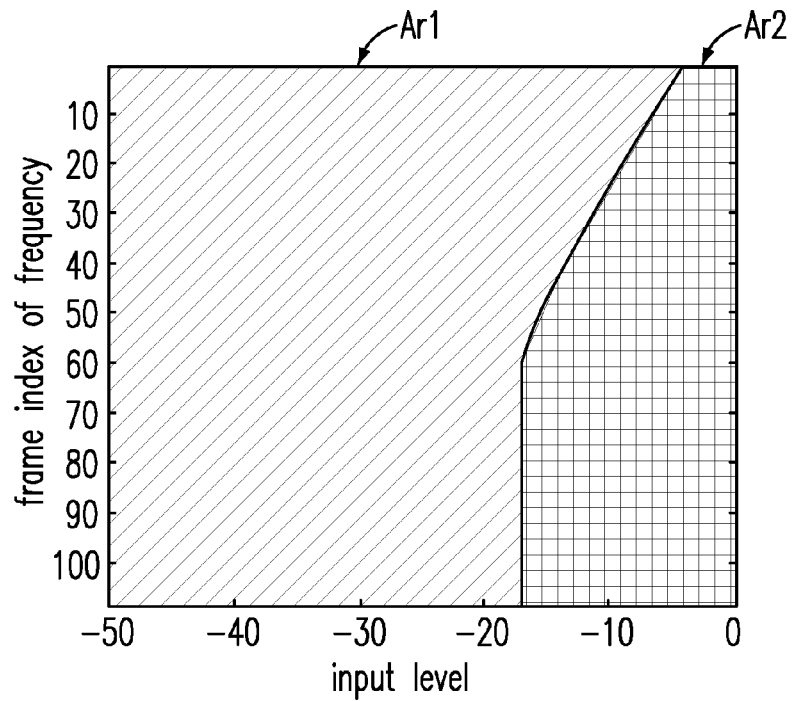
FIG. 7 shows frequency versus input level diagram according to the preferred embodiment of the present disclosure.

Please refer to FIG. 7, which shows a frequency versus input level diagram according to the preferred embodiment of the present disclosure. This diagram corresponds to profile B. The horizontal axis represents the input levels of the testing input signals Sig3 in which the unit is decibels, and the vertical axis represents a frame index of the testing input signals Sig3, wherein the frame index represents the sweep frequency in which the unit is Hertz. For example, the lower frame index 10 indicates a lower frequency band 20~199 Hz, the frame index 20 indicates frequency band 200~400 Hz, and so on. The first area Ar1 with the oblique line in FIG. 7 indicates that no overtone occurred while the input levels or the amplitudes were increasing for all the frame index, and the second area Ar2 with the cross line in FIG. 7 indicates that overtones occurred. The boundary between the first area Ar1 and the second area Ar2 represents how high the input level is required to generate overtones. Please refer to FIGS. 6 and 7. When the frequency of the testing input signal Sig3 is fixed at low frequency band such as frame index 10 and the input level or the amplitude of the testing input signal Sig3 increases gradually, the amp modeler 20 obtains a part of profile B, and the processor in the amp modeler 20 records whether any overtone occurs at the low frequency band. For example, the testing input signal Sig3 having a first frequency with the frame index 10 can be first fed to the reference amp 21. In FIG. 7, the overtone occurs at frame index 10 when the input level or the amplitude of the testing input signal Sig3 is about −7 db. Second, the testing input signal Sig3 having a second frequency with the frame index 20 can then be fed to the reference amp 21. In FIG. 7, the overtone occurs at frame index 20 when the input level or the amplitude of the testing input signal Sig3 is about −10 db. The above operations are repeated until all the initial overtone points are found in all the frequencies with the frame index 10~100. Through this approach, the diagram in FIG. 7 can be obtained.

In FIG. 7, for example, an overtone occurs at the low frame index 10 of the frequency until the input level reaches −7 db, which is higher than −10 db when an overtone occurs at the frame index 20 of frequency. This implies that the pre-amp filter 211 of the reference amp 21 suppresses more energy at the low frame index 10 of the frequency than that at the frame index 20 of the frequency. Similarly, the pre-amp filter 211 of the reference amp 21 suppresses even more energy at the low frame index 10 of the frequency than that at the frame index 60 of the frequency. According to the aforementioned, the frequency versus input level diagram can be depicted by the amp matching analyzer 25 in the amp modeler 20 or by an application installed in the amp modeler 20 by identifying occurrences when the reference amp 21 produces overtones. In addition, the frequency response characteristic of the pre-amp filter 211 is estimated accordingly, that is, what type of filter the pre-amp stage 211 is will be known.

Figure 8:
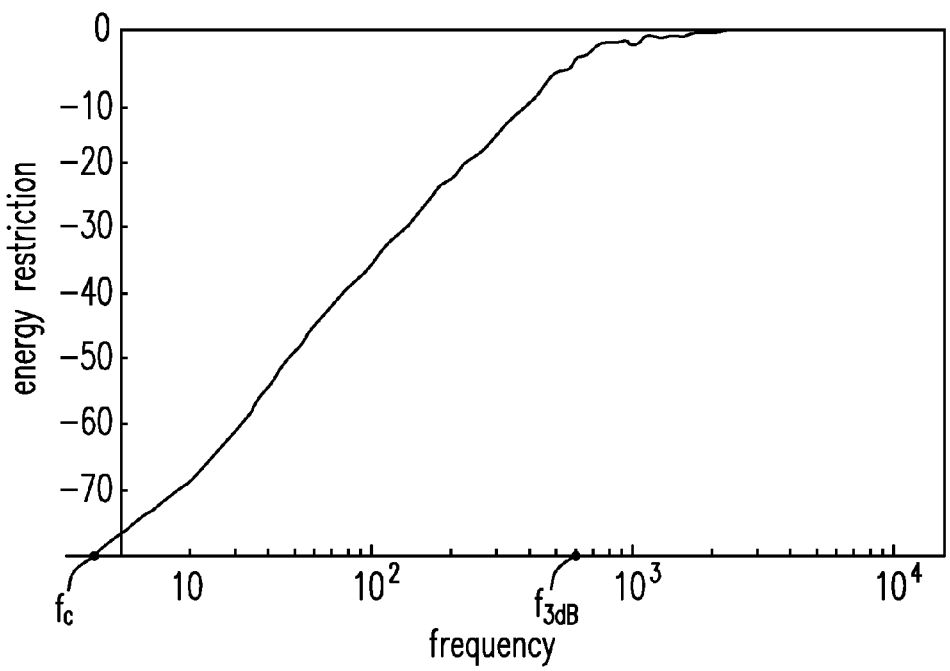
FIG. 8 shows frequency response characteristic of the pre-amp stage according to the preferred embodiment of the present disclosure.

Please refer to FIG. 8, which shows the frequency response characteristic of the pre-amp stage 211 according to the preferred embodiment of the present disclosure. The horizontal axis represents frequency on a log scale, and the vertical axis represents the energy restriction where the pre-amp stage 211 can restrict the input level in decibels. Please refer to FIGS. 7 and 8. The curve in FIG. 7 can be transformed into the curve in FIG. 8. Note that the higher the input level which begins to generate overtones in FIG. 7, the lower energy in FIG. 8 is restricted by the pre-amp stage 211. For example, an overtone occurs at frame index 10 of the frequency when the input level or the amplitude of the testing input signal Sig3 is about −7 db, and the energy is restricted to about −70 db at frequency 10 Hz. Another overtone occurs at frame index 60 of the frequency when the input level or the amplitude of the testing input signal Sig3 is about −17 db, so the energy is restricted to about only −5 db at 1000 Hz. Therefore, the frequency response characteristic of the pre-amp stage 211 can be obtained. In some embodiments, in FIG. 8, the pre-amp stage 211 is characterized as a high pass filter. In other embodiments, the pre-amp stage 211 can be also derived from a frequency-versus-input level diagram, and the pre-amp stage 211 may be characterized as a low pass filter, band pass filter, notch filter, or any type of filter having regular or irregular-shaped frequency response characteristics.

Figure 9:
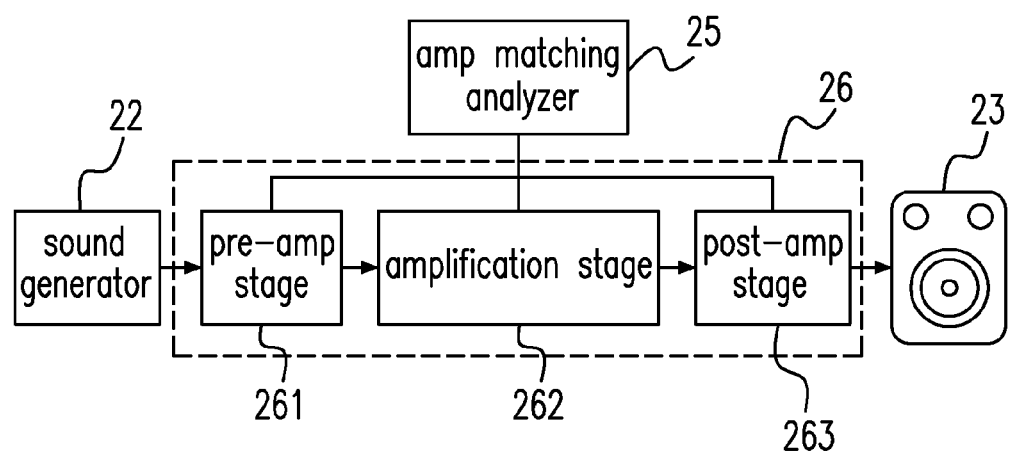
FIG. 9 shows details of the amp matching synthesizer 26 according to the preferred embodiment of the present disclosure.

Please refer to FIG. 9, which shows details of the amp matching synthesizer 26 according to the preferred embodiment of the present disclosure. The analyzed results from the amp matching analyzer 25 can be utilized to construct three main blocks as shown in the reference amp 21. The analyzed parameters are recorded and can be modeled into the amp matching synthesizer 26 of the amp modeler 20. The amp matching synthesizer 26 comprises a pre-amp stage 261, an amplification stage 262 and a post-amp stage 263.

Figure 10:
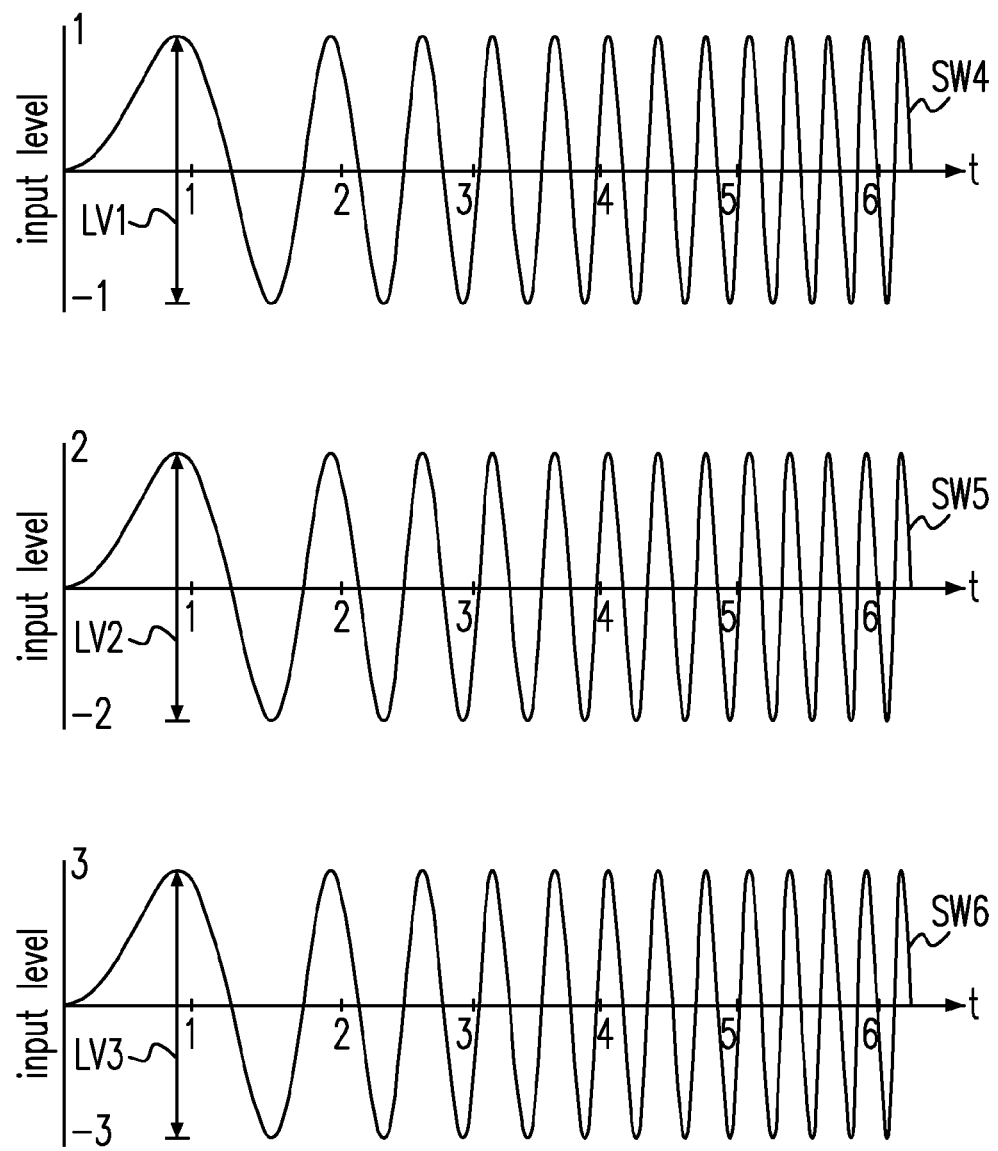
FIG. 10 shows the sweep signals according to the preferred embodiment of the present disclosure.

Please refer to FIG. 10, which shows the sweep signals according to the preferred embodiment of the present disclosure. The horizontal axis represents time, and the vertical axis represents the amplitude of the sweep signals. In some embodiment, three sweep signals are sinusoidal signals, the first sweep signal SW4 has a first fixed input level LV1, the second sweep signal SW5 has a second fixed input level LV2, the third sweep signal SW6 has a third fixed input level LV3, and so on. The frequency in each sweep signal increases at the same rate of change.

Please refer to FIGS. 7 and 10. In some embodiments, the first fixed input level LV1 in the first sweep signal SW4 of FIG. 10 corresponds to the input level −20 db in FIG. 7, the second fixed input level LV2 in the second sweep signal SW5 of FIG. 10 corresponds to the input level −15 db in FIG. 7, and the third fixed input level LV3 in the third sweep signal SW6 of FIG. 10 corresponds to the input level −10 db in FIG. 7. The first sweep signal SW4 has an index frame of frequencies from 10~100 while maintaining the first fixed input level LV1, and no overtone occurs when analyzing part of profiles B measured by the amp modeler 20. The second sweep signal SW5 has an index frame of frequencies from 10~100 while maintaining the second fixed input level LV2, and an overtone occurs when the index frame of frequency is increased from 10 to about 50. Similarly, the third sweep signal SW6 has an index frame of frequencies from 10~100 while maintaining the third fixed input level LV3, and an overtone occurs when the index frame of frequency is increased from 10 to about 25. Using a similar method, the frequency response characteristic of the pre-amp stage 211 can also be obtained.

The above two embodiments demonstrate different methods to obtain the frequency response characteristic of the pre-amp stage 20. However, the accuracy of the frequency response characteristic of the pre-amp stage 20 depends on the frequency differences or input level differences between the sweep signals. In some embodiments, the approximate frequency response characteristic of the pre-amp stage can be obtained at a first round scan, and then the transition curve between the 3 db frequency f3dB and the cut-off frequency fc can be estimated more accurately. For example, in FIG. 6, the frame index difference between sweep signal SW1 and SW2 is narrowed down. This will improve the accuracy of the frequency response characteristics between the 3 db frequency f3dB and the cut-off frequency fc. After the frequency response characteristic of the pre-amp stage 211 is obtained, the frequency response characteristic of the post-amp stage 213 can be obtained by calculating equation (6).

Although the sweep signal Sig3 in the above embodiments is adjusted by increasing either the frequency or input level, the sweep signal Sig3 can also be adjusted by decreasing either the frequency or input level, or adjusted using any traceable approach.

Figure 11:
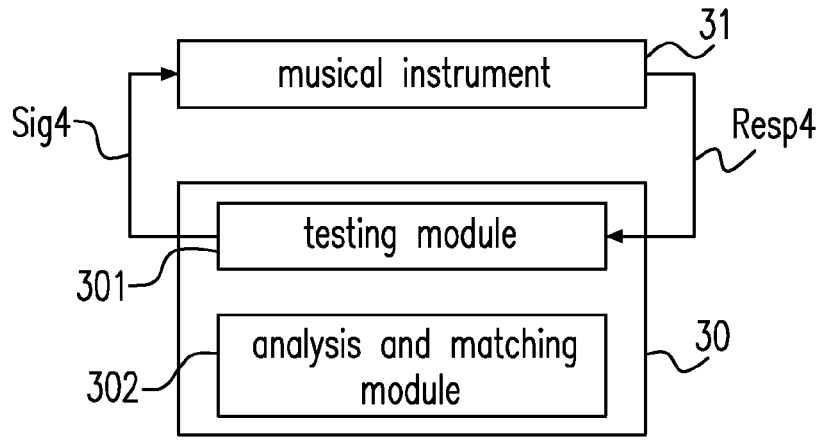
FIG. 11 shows a modeler 30 for modeling a characteristic of an musical instrument 31 according to the present disclosure.

Please refer to FIG. 11, which shows a modeler 30 for modeling characteristics of an musical instrument 31 according to the present disclosure. The modeler 30 includes a testing module 301 and analysis and matching module 302. The testing module 301 is configured to feed testing input signals Sig4 to the musical instrument 31 and obtain testing output signals Resp4 corresponding to the testing input signals Sig4. The analysis and matching module 302 is configured to model the characteristics by identifying occurrences when the musical instrument 31 produces overtones.

Figure 12:
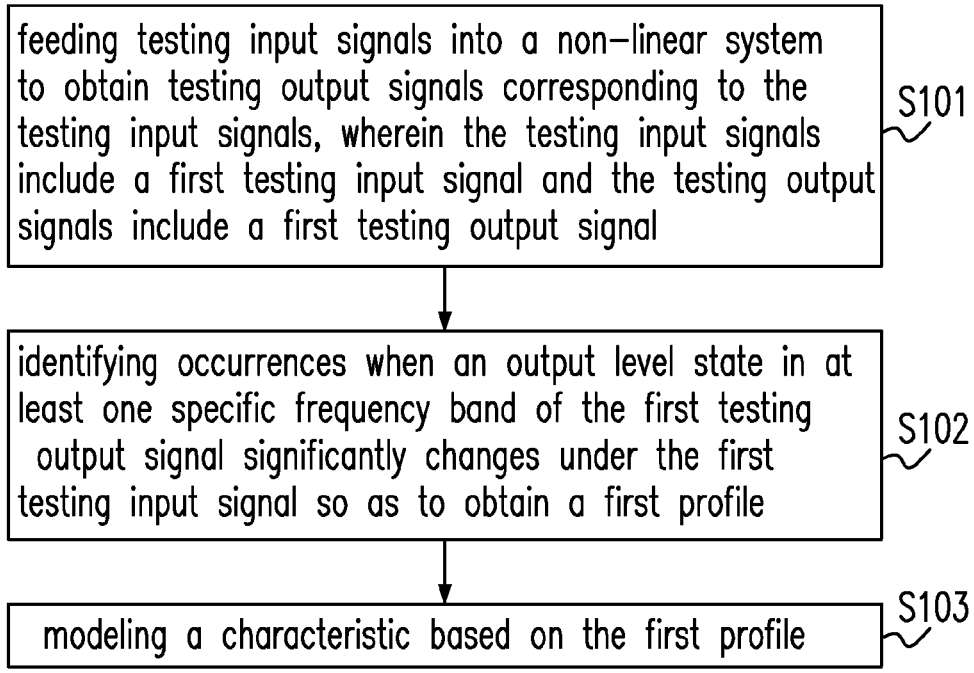
FIG. 12 shows a method of modeling a characteristic of an musical instrument.

Please refer to FIG. 12, which shows a method of modeling characteristics of a musical instrument. Please refer to FIGS. 11 and 12, the method comprises: Step S101: feeding testing input signals into the non-linear system to obtain testing output signals corresponding to the testing input signals, wherein the testing input signals include a first testing input signal and the testing output signals include a first testing output signal; Step S102: identifying occurrences when an output level state in at least one specific frequency band of the first testing output signal significantly changes under the first testing input signal so as to obtain a first profile; Step S103: modeling the characteristic based on the first profile.

Figure 13:
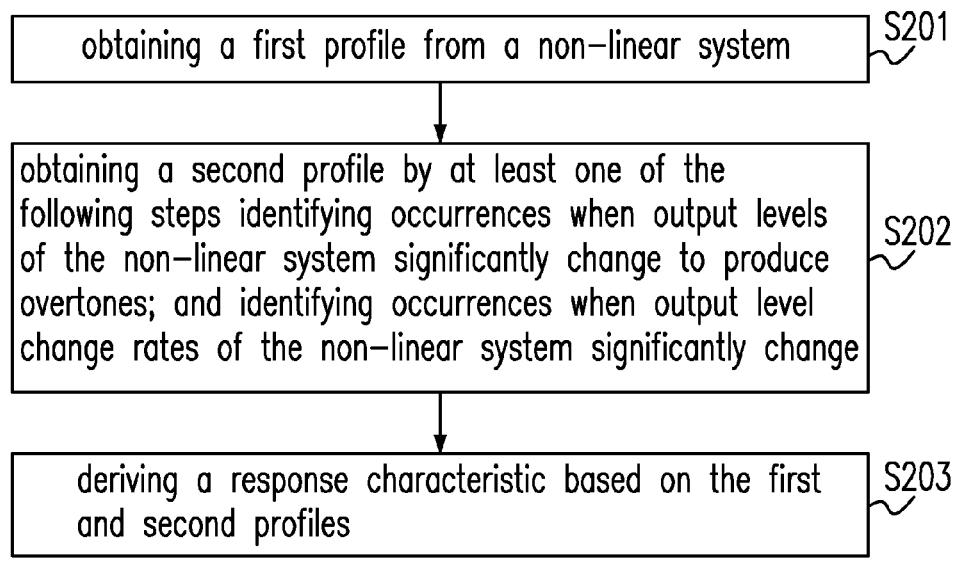
FIG. 13 shows another method of modeling a response characteristic for an musical instrument.

Please refer to FIG. 13, which shows another method of modeling response characteristics for a musical instrument. The method comprises: Step S201: obtaining a first profile from the non-linear system; Step S202: obtaining a second profile by at least one of the following steps: identifying occurrences when output levels of the non-linear system significantly change to produce overtones; and identifying occurrences when output level change rates of the non-linear system significantly change; and Step S203: deriving the response characteristic based on the first and second profiles.

Figure 14:
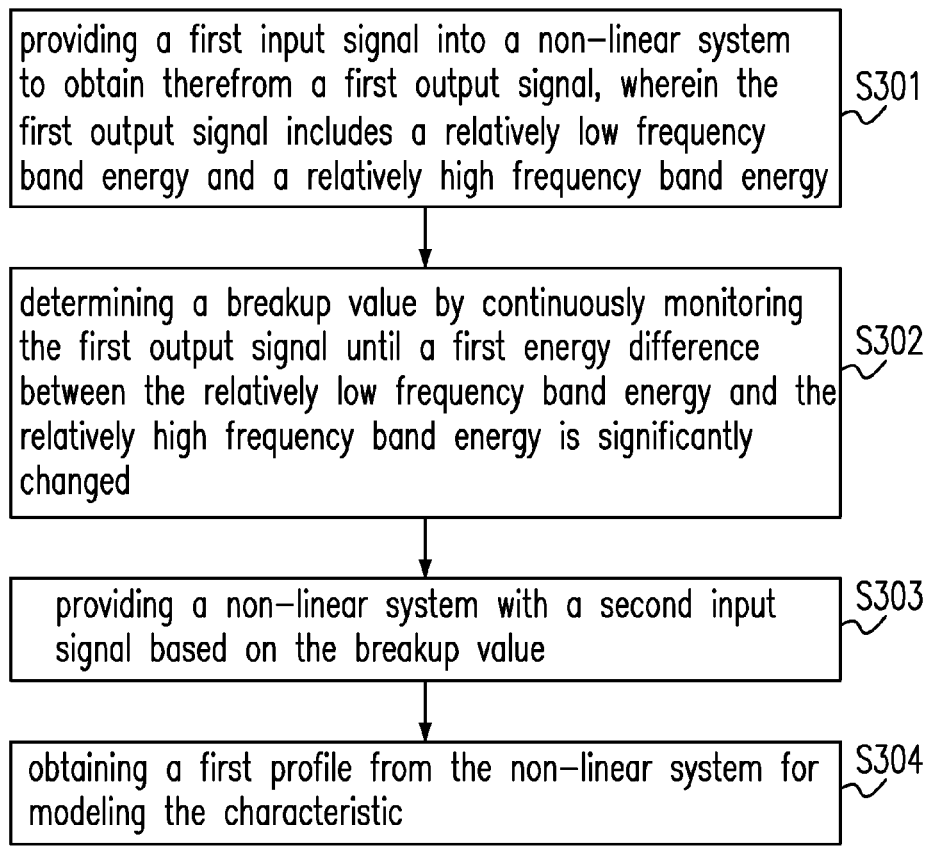
FIG. 14 shows another method of modeling a response characteristic for an musical instrument.

Please refer to FIG. 14, which shows another method of modeling response characteristics for an musical instrument. The method comprises: Step S301: providing a first input signal into the non-linear system to obtain therefrom a first output signal, wherein the first output signal includes a relatively low frequency band energy and a relatively high frequency band energy; Step S302: determining a breakup value by continuously monitoring the first output signal until a first energy difference between the relatively low frequency band energy and the relatively high frequency band energy is significantly changed; Step S303: providing the non-linear system with a second input signal based on the breakup value; and Step S304: obtaining a first profile from the non-linear system for modeling the characteristic.

Figure 15:
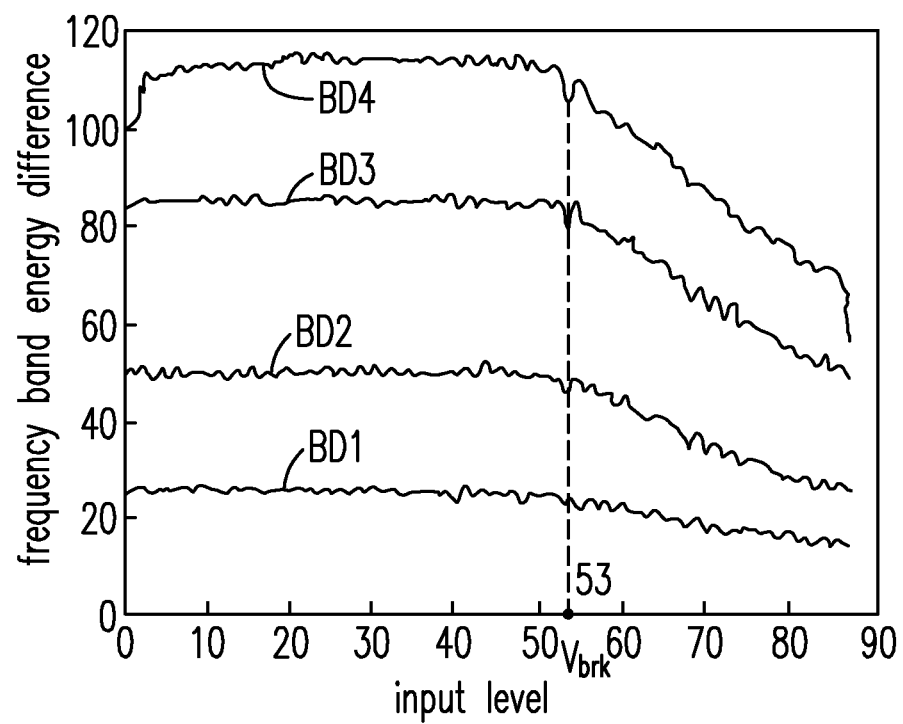
FIG. 15 shows frequency band energy difference according to the preferred embodiment of the present disclosure.

Please return to FIG. 2. In order to maintain the reference amp 21 in a linear region, the amplitude of the testing input signal Sig1 such as white signal should maintain within a specific limitation, which is called a breakup value. We will now describe the method of estimating the breakup value. Please refer to FIG. 15, which shows the frequency band energy difference according to the preferred embodiment of the present disclosure. The horizontal axis represents the input level of the testing input signal Sig1, and the vertical axis represents the frequency band energy difference. In some embodiments, the testing input signal Sig1 can have a frequency ranged of 200 Hz~10000 Hz, which may be divided into five frequency bands. There are frequency band 1: 200 Hz~1000 Hz, frequency band 2: 1000 Hz~3000 Hz, frequency band 3: 3000 Hz~5000 Hz, frequency band 4: 5000 Hz~7000 Hz and frequency band 5: 7000 Hz~10000 Hz. In FIG. 15, the band energy difference curve BD1 represents the energy difference between frequency bands 1 and 2, the band energy difference curve BD2 represents energy difference between frequency band 1 and 3, the band energy difference curve BD3 represents the energy difference between frequency bands 1 and 4 and the band energy difference curve BD4 represents energy difference between frequency bands 1 and 5.

Figure 16:
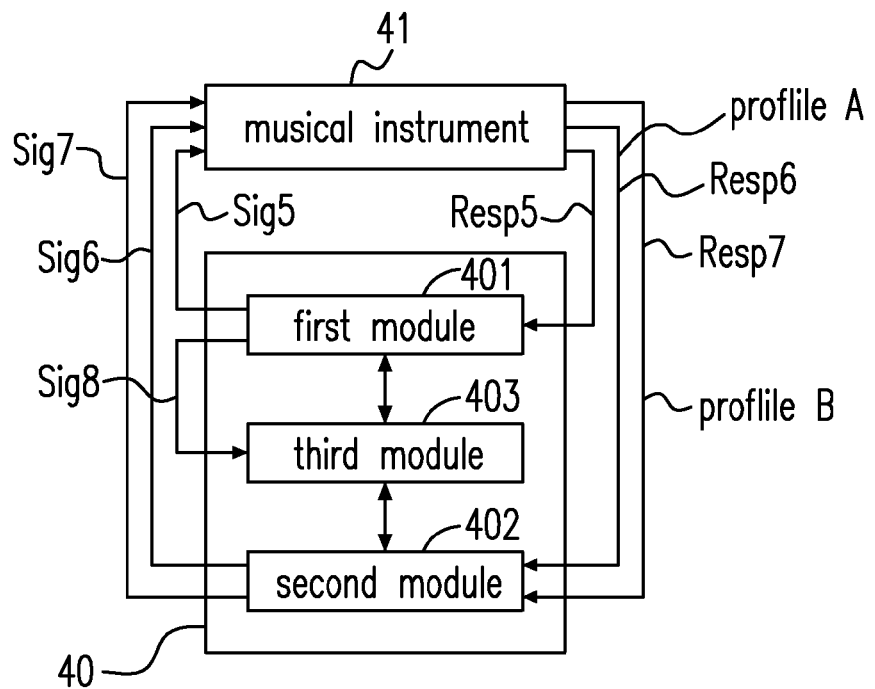
FIG. 16 shows a modeler for modeling a characteristic of an musical instrument according the preferred embodiment of the present disclosure.

Please refer to FIG. 16, which shows a modeler 40 for modeling characteristics of an musical instrument 41 according the preferred embodiment of the present disclosure. The modeler 40 comprises a first module 401, a second module 402 and a third module 403. Please refer to FIGS. 15 and 16. The first module 401 is configured to provide the musical instrument 41 with a first input signal Sig5, obtain a first output signal Resp5 from the musical instrument 41, wherein the first output signal Resp5 includes a relatively low frequency band energy and a relatively high frequency band energy and determines a breakup value by continuously monitoring the first output signal Resp5 until a first energy difference (i.e., one of BD1, BD2, BD3, BD4 or any combination thereof) between the relatively low frequency band energy and the relatively high frequency band energy significantly changes. The second module 402 is configured to provide the musical instrument 41 with a second input signal Sig6 based on the breakup value and obtain profile A derived from a second output signal Resp6 from the musical instrument 41 to model the characteristics. The third module 403 can communicate with the first module 401 and the second module 402, and this can be implemented by hardware, firmware, software, or any combination thereof. The hardware may include a processor, DSP, or any other component that can analyze the first output signal Resp5 and the first profile Resp6. The software may include an application installed in the modeler 40. The modeler 40 may be a personal computer, handset, smart phone, notebook, mobile device or the like.

Please refer to FIGS. 15 and 16. In some embodiments, the first input signal Sig5 is a chirp signal. When the input level of the first input signal Sig5 increases to reach about 53 units, the band energy difference curves BD1~BD4 are significantly changed, for example, decreasing, which indicates that the musical instrument 41 has begun to enter the non-linear region at 53 units of the input level of the first input signal Sig5. Thus, the breakup value Vbrk of the first input signal Sig5 can be obtained. The second module 402 can be a computational unit that can multiply the breakup value and the white noise to obtain the second input signal Sig6, a composite signal, and can obtain the frequency response of the first profile Resp6 while maintaining the musical instrument 41 in the linear region.

The second module 402 provides a third input signal Sig7 to the musical instrument 41 to obtain a third output signal Resp7, and the third module 403 analyzes the third output signal Resp7 to obtain profile B. Please refer to FIG. 17, which shows that a third module 403 models the characteristics of the musical instrument 41 according to the preferred embodiment of the present disclosure. The third module 403 models the characteristics of the musical instrument 41 by constructing at least a pre-amp 4031 and a post-amp 4033 based on the first profile Resp6. The pre-amp 4031 has a first frequency response characteristic, the post-amp stage 4032 has a second frequency response characteristic, and the first profile Resp6 represents a first frequency response. A product of the first frequency response characteristic and the second frequency response characteristic is theoretically proportional to the first frequency response. The third module 403 obtains the first frequency response characteristic of the pre-amp 4031 by identifying occurrences when the musical instrument 41 produces overtones based on profile B. The first frequency response is divided by the first frequency response characteristic to obtain the second frequency response characteristic.

Figure 17:
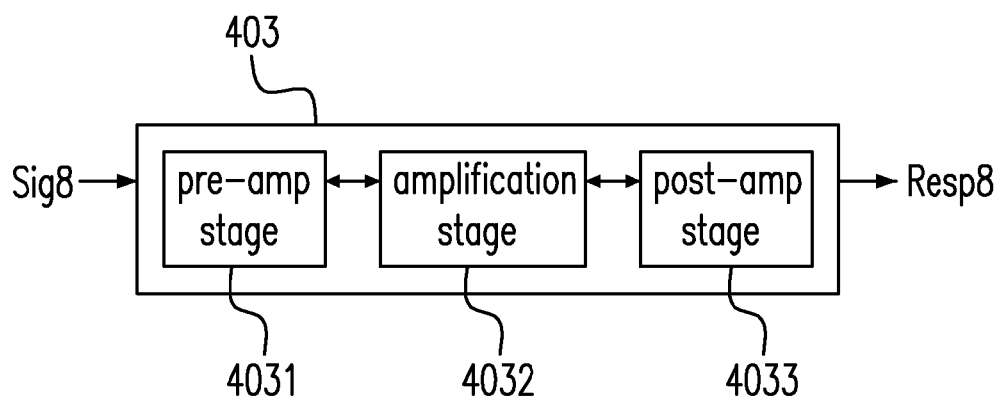
FIG. 17 shows a third module 403 models the characteristic of the musical instrument 41 according to the preferred embodiment of the present disclosure.

Please refer to FIGS. 15, 16 and 17. The third module 403 further models the characteristics by constructing an amplification stage 4032 between the pre-amp stage 4031 and the post-amp stage 4033. Please refer to FIG. 18, which shows a characteristic curve CV1 of the amplification stage 4032 according to the preferred embodiment of the present disclosure. The non-linear range (or region) NL1 and NL2 is also called the saturation range, which indicates that the output level will not increase more slowly after the input level reaches the saturation value Sat1 or Sat2. The horizontal axis represents the normalized input level of the input signal, and the vertical axis represents the normalized output level of the output signal, but there is little growth of the output level in practical situations. The amplification stage 4032 has the characteristic curve CV1 with a linear range LR1 and a non-linear range NL1, NL2, and there are an upper limit UM1 and a lower limit LM1 between the linear range LR1 and the non-linear range NL1, NL2 and the linear range LR1 has a gain characteristic GC1 or GC2 around a quasi working point Q1. The slope of the gain characteristic GC1 is steeper than that of the gain characteristic GC2 around the quasi working point Q1, which indicates that the saturation value Sat1 of the gain characteristic GC1 is smaller than that of the saturation value Sat2 of the gain characteristic GC2. In some embodiments, the characteristic curve CV1 can be symmetric, and the lower limit LM1 can be derived from the right half of the characteristic curve CV1, in which the input level and output level are equal to or greater than zero, and vice versa.

Figure 18:
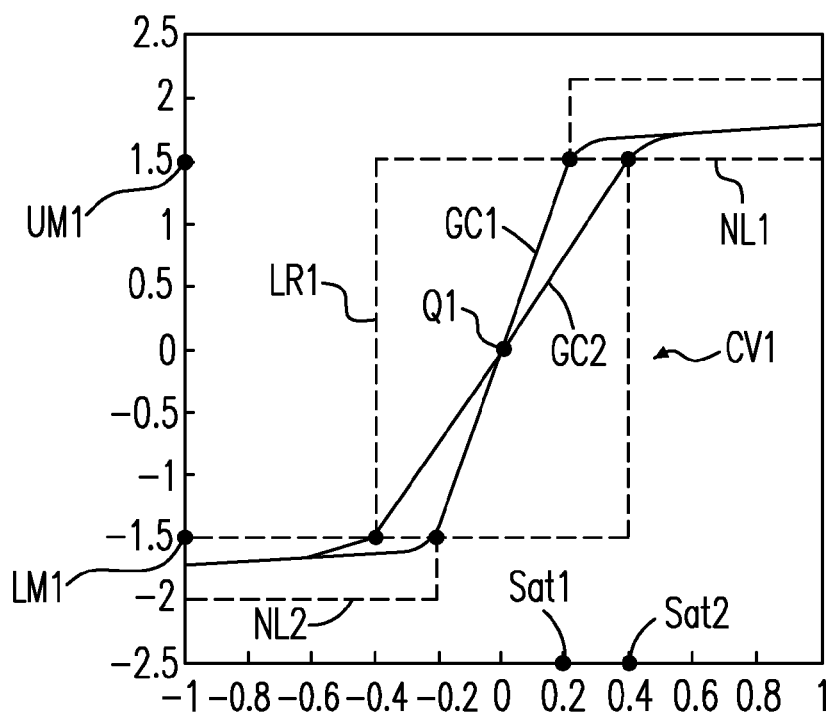
FIG. 18 shows a characteristic curve of the amplification stage according to the preferred embodiment of the present disclosure.

Please refer to FIGS. 15, 16 and 18. The musical instrument 41 begins to enter into the non-linear region at the saturation value Sat1, Sat2 which are normalized, 0.2 and 0.4 units respectively. If (1) the saturation value, either Sat1 or Sat2, or (2) gain characteristic, either GC1 or GC2, can be obtained, and both the pre-amp frequency response characteristic $H_{pre-amp}(k)$ and the post-amp frequency response characteristic $H_{post-amp}(k)$ are also obtained, a estimated overall characteristic $H_{est}(k)$ including all stages of the musical instrument 41 can be modeled as follows:

$$H_{est}(k)=H_{pre-amp}(k)*G_{amp}(k)\times H_{post-amp}(k) \quad (12)$$

which is similar to that the model described in equation (1).

In equation 8, $G_{amp}(k)$ is a frequency response characteristic of the amplification stage 4032 under a gain function of the normalized input level and output level, and the gain function determines whether the gain characteristic is similar to that of the musical instrument 41 in the linear range LR1. For example, the gain function can have different types of the gain characteristics GC1 and GC2, wherein the gain characteristic GC1 has a slope higher than that of the gain characteristic GC2 around the quasi working point Q1, and the different type of the gain characteristics GC1 and GC2 can be predetermined or dynamically allocated for further analysis. The modeler 40 can select the gain characteristic GC1 and try to match an expression of the energy difference in FIG. 15 while adjusting the input level by simulation. If they do not match, then the modeler 40 selects the gain characteristic GC2 to match it. Because the upper limit UM1 and lower limit LM1 can be known in advance (for example, from the stage of determining the breakup value Vbrk), the saturation value Sat1 or Sat2 can be derived when the gain characteristic GC1 or GC2 is obtained. In FIG. 18, because the gain characteristic GC1 has a slope steeper than that of the gain characteristic GC2, the saturation value Sat1 is smaller than the saturation value Sat2, but the two gain characteristics GC1, GC2 have the same upper limit UM1 and lower limit LM1.

Please refer to FIGS. 16 and 17. The first module 401 further provides a fourth input signal Sig8 to the pre-amp stage 4031, amplification stage 4032, and post-amp stage 4033 to obtain a fourth output signal Resp8.

Figure 19:
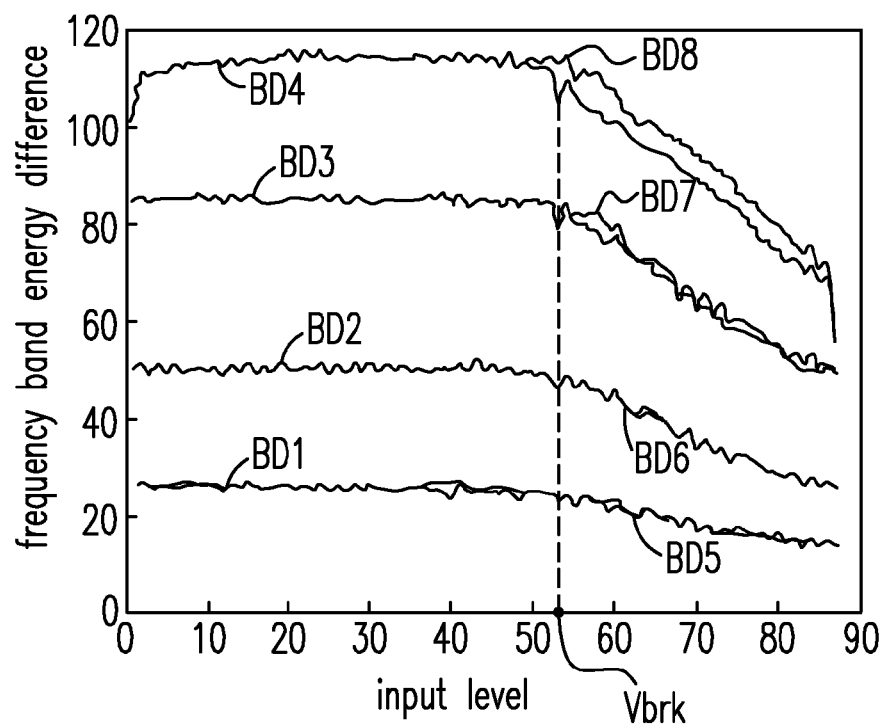
FIG. 19 shows a matching of the energy band difference according to the preferred embodiment of the present disclosure.

Please refer to FIG. 19, which shows a matching of the energy band difference according to the preferred embodiment of the present disclosure. Please refer to FIGS. 16, 18 and 19. The fourth input signal Sig8 has an input level and the fourth output signal Resp8 includes a relatively low frequency band energy and a relatively high frequency band energy wherein there is a second energy difference (i.e., one of BD5, BD6, BD7, BD8 or any combination thereof) between the relatively low frequency band energy and the relatively high frequency band energy. The third module 403 can determine the input level and the second energy difference BD5, BD6, BD7 and/or BD8 begins to decrease by adjusting the gain characteristic of the linear range LR1. For example, the steeper slope of the gain characteristic GC1 indicates that when the third module 403 selects to match the musical instrument 41, the lower input level the second energy difference BD5, BD6, BD7 and/or BD8 will begin to decrease, and vice versa.

Please refer to FIGS. 16~19. In some embodiments, the first module 401 adjusts the input level of the fourth input signal Sig8 until the third module 403 detects that an expression of the energy difference BD1, BD2, BD3, BD4 in FIG. 15 is similar to that of the second energy difference BD5, BD6, BD7, BD8 respectively to determine the gain characteristic GC1 or GC2 of the linear range LR1 when the upper limit UM1 and the lower limit LM1 of the amplification stage 4032 are fixed. For example, the third module 403 selects the gain characteristic GC1 to simulate, and increases the input level of the fourth input signal Sig8, if the musical instrument 41 has a different gain characteristic from the gain characteristic GC1, neither the expression of the first energy difference BD1, BD2, BD3, BD4 nor the second energy difference BD5, BD6, BD7, BD8 will match when the input level of the fourth input signal Sig8 increases. In this case, the third module 403 selects another gain characteristic to match one-by-one. Thus, the gain characteristic GC1, GC2, or any other gain characteristics matching the gain characteristic of the musical instrument 41 can be determined. Accordingly, the overall characteristic including all stages of the musical instrument 41 can be modeled.

Figure 20:
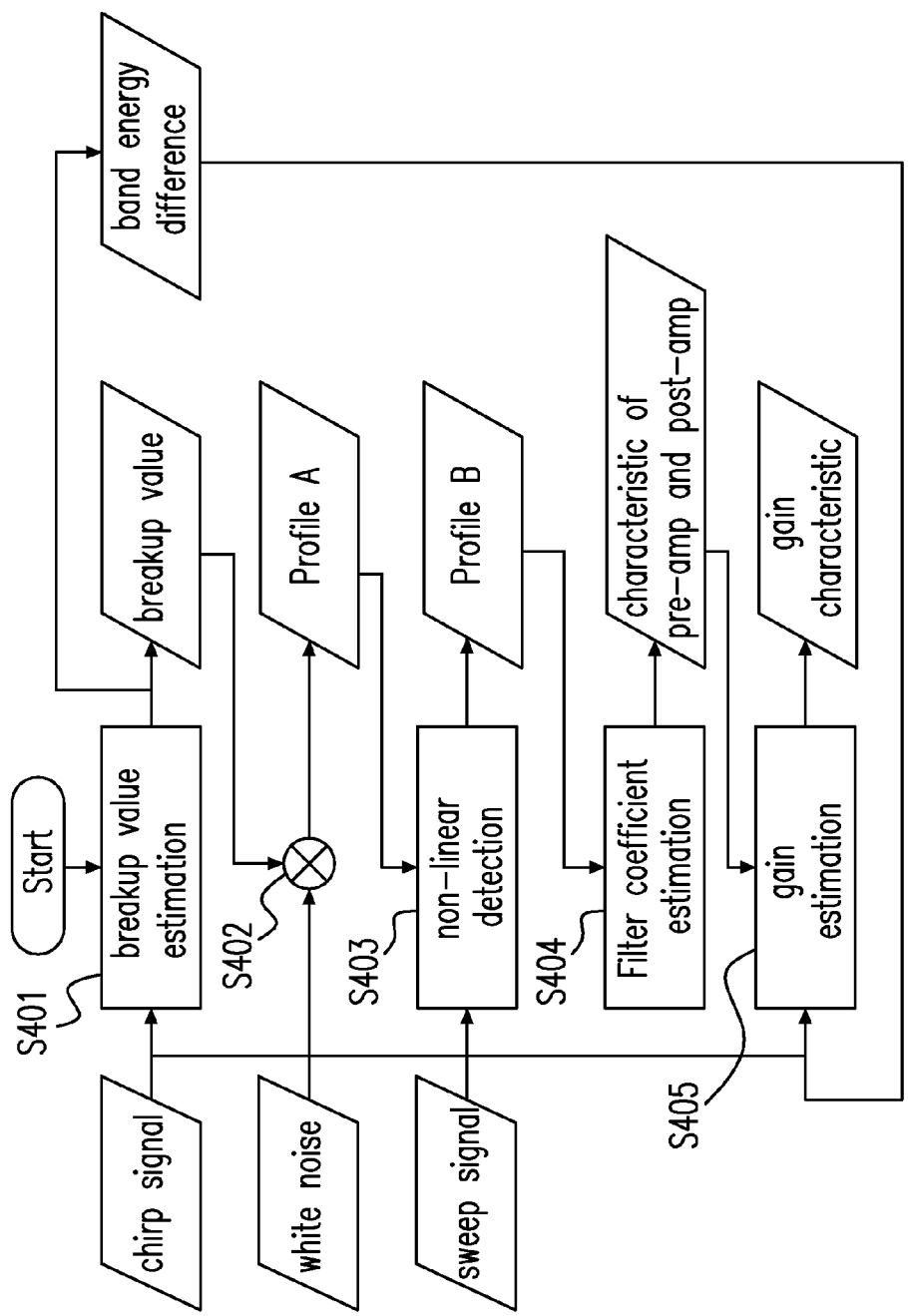
FIG. 20 shows a process of modeling the overall stages according to the preferred embodiment of the present disclosure.
Figure 21:
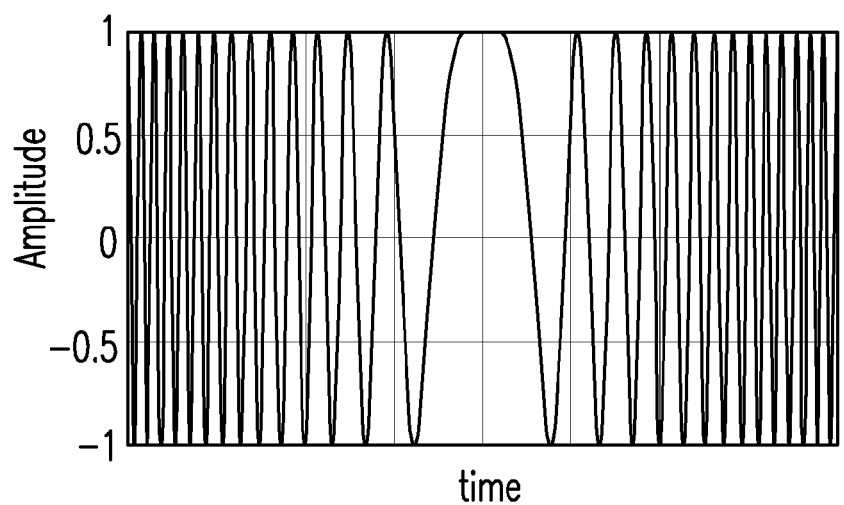
FIG. 21 shows a typical chirp signal according to the preferred embodiment of the present disclosure.

Please refer to FIG. 20, which shows a process of modeling the overall stages according to the preferred embodiment of the present disclosure. Before the modeler 40 models the musical instrument 41, the chirp signal is used to estimate the breakup value Vbrk. Please refer to FIG. 21, which shows a typical chirp signal according to the preferred embodiment of the present disclosure. The chirp signal is a signal in which the frequency increases ('up-chirp') or decreases ('down-chirp') over time. The sweep signal can also be used to estimate the breakup value Vbrk. Please refer to FIGS. 15, 16 and 20. In step S401, the first input signal Sig5 is provided to the musical instrument 41 to obtain therefrom the first output signal Resp5, wherein the first output signal includes a relatively low frequency band energy and a relatively high frequency band energy. The breakup value Vbrk is determined by continuously monitoring the first output signal until the first energy difference BD1, BD2, BD3 and/or BD4 between the relatively low frequency band energy and the relatively high frequency band energy significantly changes, for example, linearly decreasing. Therefore, the expression of the frequency energy difference is obtained and can be used to later matching. After the breakup value is obtained, step S402 shows that the musical instrument 41 is provided with a second input signal Sig6 based on the breakup value Vbrk, and profile A is obtained from the musical instrument 41 to model the characteristic. For example, the second input signal Resp6 is a composite signal which the second module 402 multiplies by a white noise signal and the breakup value Vbrk in the time domain. Profile A is proportional to a product of the frequency response characteristic of the pre-amp stage 4031 and the frequency response characteristic of the post-amp stage 4033 as shown in equation (3). The amplitude of the frequency response characteristics of the pre-amp stage 4031 and the post-amp stage 4033 can be normalized when we are only concerned about the shape of the frequency response characteristics.

In some embodiments, in step S402, the white noise signal is replaced by a transform filter pair, a first chirp filter and a second chirp filter, which can approximate the characteristic of an ideal white noise signal or an ideal delta function. That is, the second chirp filter is an inverse filter of the first chirp filter. For example, if a first impulse in the time domain is input to the first chirp filter to generate a chirp like signal, and the chirp like signal is further input to the second chirp filter to output a second impulse, then the second impulse will approximate to the first impulse. This transform filter pair has some benefits, one of them is to solve the problem that generating an ideal white noise which needs a sharp energy distribution in a relative short period in time domain is difficult, and the reliability and accuracy of the characteristic analysis and estimation will be affected if the white noise is not ideal. In contrast, the chirp like signal generated by the first chirp filter can have a moderate energy distribution in a relative long period, so there would be no problem to generate an ideal signal. Therefore, the transform filter pair of the first chirp filter and the second chirp filter can be used to model an ideal white noise and enhance the reliability and accuracy of the characteristic analysis and estimation. In addition, the chirp signal may have frequencies scanned from low to high, for example, 0~22050 Hz, and the sampling rate for Fourier Transform is 44100 Hz.

Please refer to FIGS. 16, 17 and 20. After profile A is obtained, step S403 shows that the third signal Sig7 is fed to the musical instrument 41 to obtain profile B by non-linear detection. Profile B is obtained by identifying occurrences when the musical instrument 41 produces overtones. In some embodiments, Profile B is obtained by identifying occurrences when the musical instrumental enters into the non-linear region, e.g., overtones in side lobe of each fundamental frequency are identified or a significant change of a change rate of main lobe level at each fundamental frequency (first order harmonic). For example, in FIG. 6($d$), the varied slope m is equal to or below the predetermined threshold slope $m_{th}$, wherein the varied slop m can be defined by a main lobe level difference divided by an input level difference. Step S404 shows that the filter coefficients of pre-amp 4031 and stage 4031 and post-amp stage 4033 are estimated, i.e., the response characteristic of the pre-amp stage 4031 is derived based on profile B, and the response characteristic of the post-amp stage 4033 is derived from equation (3) based on profile A and the response characteristic of the pre-amp 4031. Preferably, each impulse response characteristic of the pre-amp and the post-amp stages 4031, 4033 in the time domain can be obtained by constructing one of an FIR and an IIR filter based on one of the first and second frequency response characteristics.

In some embodiments, in Step S403, if Profile B is obtained by identifying occurrences when a significant change of a change rate of main lobe level at each fundamental frequency, then Step S401 which estimates the breakup value Vbrk can be omitted. For example, when the varied slope m for main lobe level of each fundamental frequency is equal to or below the predetermined threshold slope $m_{th}$, it indicates that the breakup value is identified for main lobe level of each fundamental frequency, therefore Step S401 can be omitted. After the frequency response characteristics of the pre-amp stage 4031 and the post-amp stage 4033 are obtained, the shape or the energy distribution of the pre-amp stage 4031 and the post-amp stage 4033 are known. In FIGS. 17 and 18, because the upper limit UM1 and lower limit LM1 are known, the gain characteristic of the linear region LR1 can be estimated when the upper limit UL1 or lower limit LM1 is fixed. Please refer to FIGS. 17 and 20 simultaneously, Step S405 shows that the fourth input signal Sig8 is provided into the pre-amp stage 4031, amplification stage 4032 and post-amp stage 4033 to obtain a fourth output signal Sig8, wherein the fourth output signal Sig8 includes a relatively low frequency band energy and a relatively high frequency band energy, and there is a second energy difference between the relatively high frequency band energy and the relatively low frequency band energy, and the fourth input signal Sig8 can be a chirp signal or sweep signal and has an input level. Please refer to FIG. 19. The input level where the second energy difference begins to decrease is determined by adjusting the gain characteristic of the linear range. For example, referring to FIGS. 16, 17, 18, 19 and 20, the input level of the fourth input signal Sig8 is adjusted until the third module 403 detects that an expression of the first energy difference is similar to the second energy difference to determine the gain characteristics GC1, GC2 of the linear range LR1 where the upper limit UM1 and/or the lower limit LM1 of the amplification stage 4032 are fixed. Thus, the gain characteristic GC1, GC2 or any other gain characteristic is determined by matching procedure above.

After each characteristic of the entire stages is analyzed, each characteristic can be transformed into parameters for storage in the storage device or shared in the cloud through the internet. The modeler 40 can be implemented by a PC, mobile or other hardware device such as a DSP. The musician plugs his or her musical instrument into the modeler 40, and off-line or on-line can adjust the different types of parameters from the cloud via an interface on the modeler 40, and thus they can synthesize any new timbre which they desire by adjusting the parameters. These parameters include energy distribution of the frequency response in the pre-amp stage 4031 of the modeler 40, shaper or moderate slope of the gain characteristic in the amplification stage 4032 of the modeler 40 and a similar equalizer function in the post-amp stage 4033 of the modeler 40, or any combination thereof. For example, if the musician desires a distortion timbre for electric guitar, he/she might select a set of characteristic parameters which models an electric guitar amp and adjust a gain parameter to a sharp, steep gain curve in order to play a distorted sound with the electric guitar.

Figure 22:
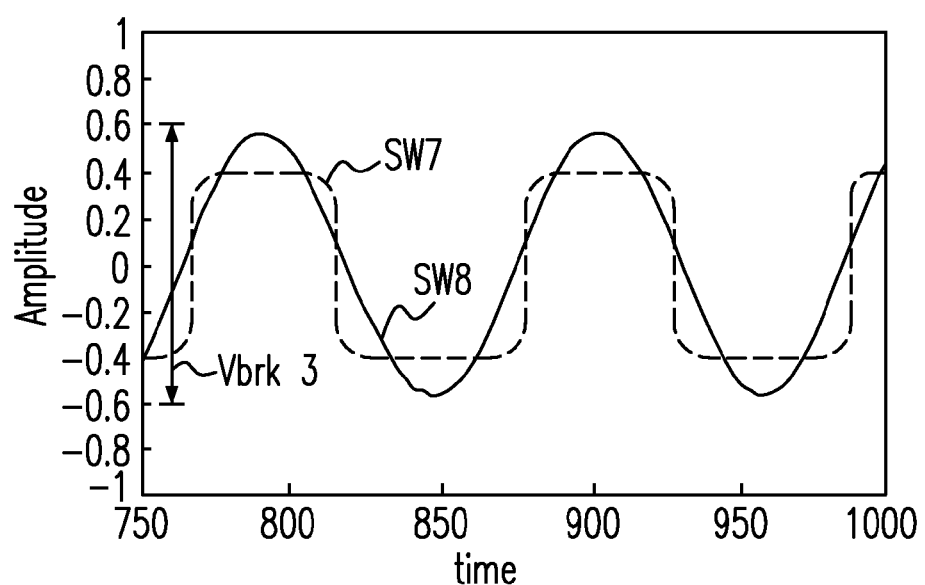
FIG. 22 shows a distortion sine signal according to the preferred embodiment of the present disclosure.

Please refer to FIG. 22, which shows a distortion sine signal SW7 as dash line according to the preferred embodiment of the present disclosure. The distortion sine signal SW7 is clamped at the peak and interfered because higher order harmonics occur. The horizontal axis represents time, and the vertical axis represents amplitude in the time domain. Please refer to FIG. 23, which shows harmonics of the distortion sine signal SW7 in the frequency domain according to the preferred embodiment of the present disclosure. The horizontal axis represents frequency, and the vertical axis represents energy of the distortion sine signal SW7 in the frequency domain. In FIGS. 22 and 23, when the amplitude of the non-distortion sine signal SW8 is in a range of the breakup value Vbrk3, main lobe Fund1 occurs, the rest is noise having ignorable energy. When the amplitude of the non distortion sine signal SW8 is greater than or equal to the range of the breakup value Vbrk3, the waveform of the distortion sine signal SW7 is similar to a rectangular waveform as shown in the dashed line, and harmonics Harm1, Harm2, . . . Harmn occur, which means overtones occur. The skilled person knows that there is a rectangular waveform in the time domain, then a sine waveform will be in the frequency domain as in FIG. 23. In some embodiments, the definition that the harmonic Harm1 occurs is when the energy peak EP2 of the harmonic Harm1 is greater than or equal to an energy value EV1. The energy value EV1 is calculated by subtracting the energy difference Eref1 from an energy peak EP1 of the first order harmonic Harm1. In other embodiments, the definition that the harmonic Harm1 occurs is when the energy peak EP2 of the harmonic Harm1 is greater than or equal to an energy difference Eref2 starting from an energy value EV2 of a noise floor NF.

A user can model the musical instrument 41 using a system which analyzes the parameters of the musical instrument 41, then the system creates a desired timbre which is synthesized based on at least one of the parameters. This process can be designed to be user-friendly and performed without expertise. The system can also provide an automated process to help the user.

Figure 24:
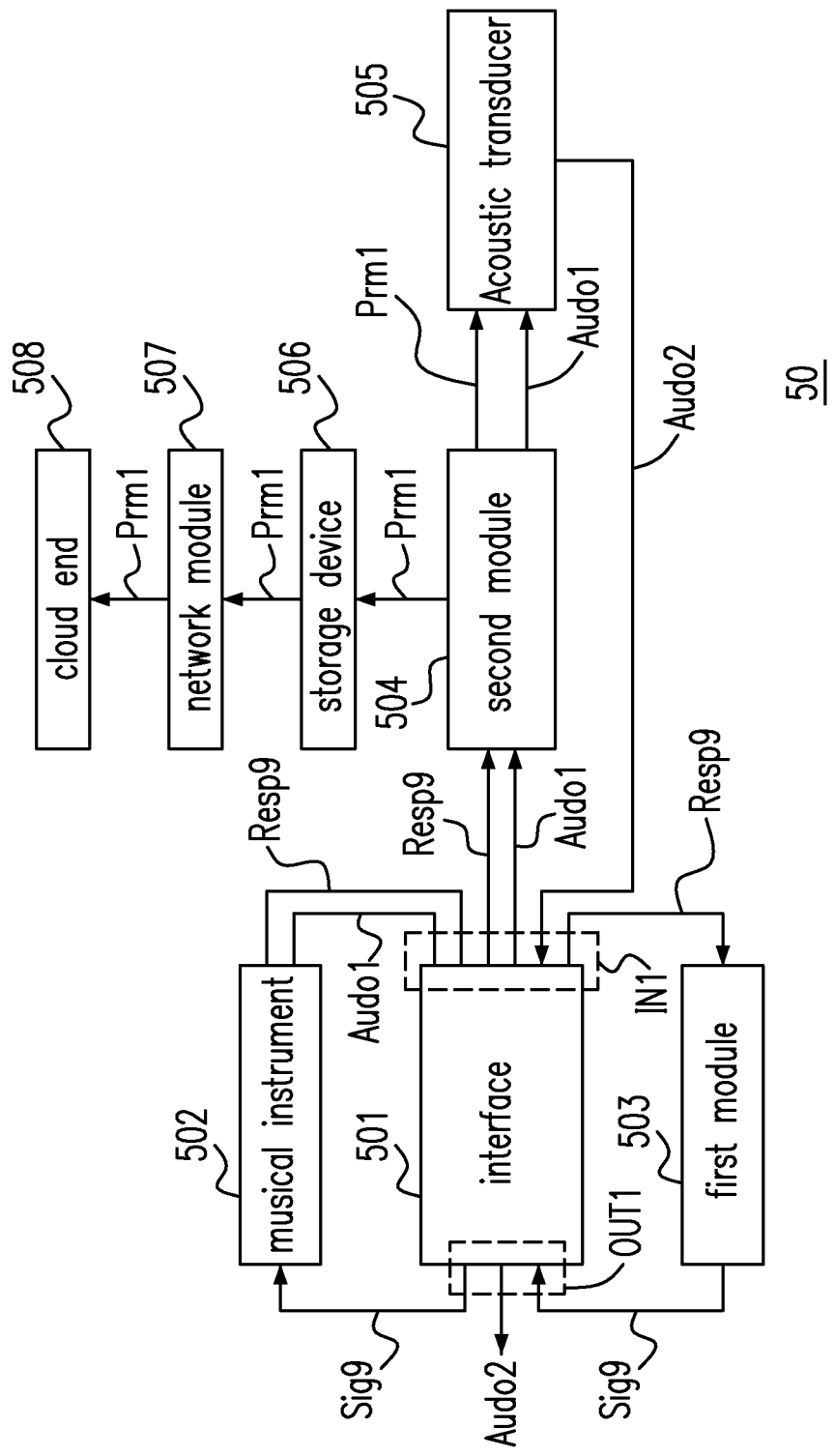
FIG. 24 shows a system for modifying an audio signal Audo1 according to the preferred embodiment of the present disclosure.

Please refer to FIG. 24, which shows a system 50 for modifying an audio signal Audo1 according to the preferred embodiment of the present disclosure. The system 50 comprises an interface 501, a first module 503 and a second module 504. The interface 501 is configured to interact with an musical instrument 502. The first module 503 is coupled to the interface 501 to provide the musical instrument 502 with a set of testing input signals Sig9 and obtain a set of testing output signals Resp9 from the musical instrument 502. The second module 504 coupled to the interface 501 to perform functions including: analyzing the set of testing output signals Resp9 to obtain a set of parameters Prm1; constructing an acoustic transducer 505 to model characteristics of the musical instrument 502 based on the set of parameters Prm1; and receiving the audio signal Audo1 to modify the audio signal Audo1 with the acoustic transducer 505, wherein the second module 504 obtains the set of parameters Prm1 at least by identifying occurrences when the musical instrument 502 produces overtones based on the set of testing output signals Resp9.

In FIG. 24, the interface 501 has an input end IN1 thereon to receive at least one of the set of first testing output signals Resp9 and the audio signal Audo1, and has an output end OUT1 thereon to output at least one of the set of first testing input signals Sig9 and the modified audio signal Audo2. The second module 504 receives the audio signal Audo1 via the input end IN1 of the interface 501 and synthesizes the audio signal Audo1, i.e., the acoustic transducer 505 modifies the audio signal Audo1 to output the modified audio signal Audo2 via the output end OUT1 of the interface 501.

In some embodiments, the interface 501 may include a hardware converter transforming an analog sound signal to a digital signal, a software driver or application installed on a personal computer or a mobile device, a connection cable, or any combination thereof. The musical instrument 502 may be an amplifier and can be in digital or analog form, such as a percussion instrument, a wind instrument, a stringed instrument, an electronic instrument, a sound cabinet, a loudspeaker box and so on. If the musical instrument has no digital signal to output, the interface may have a sound capture device to record the sound for analysis, such as a microphone. The personal computer or the mobile device can include at least one of the first module 503 and the second module 504.

The first module 503 can include a signal mixer that performs mathematic operations on the testing output signals Resp9 and a breakup value, and provides the musical instrument with a sweep signal or a chirp signal via the interface 501. The first module 503 inputs a first testing input signal to the musical instrument 502 via the interface 501 to obtain a first testing output signal, and the second module 504 analyzes the first testing output signal to obtain a first profile, wherein the first testing input signal is a white signal. The first module 503 inputs a second testing input signal to the musical instrument 502 to obtain a second testing output signal, and the second module 504 analyzes the second testing output signal to obtain a second profile, wherein the second testing input signal is a sweep signal. The second module 504 obtains the set of parameters Prm1 at least by identifying occurrences when the musical instrument 502 produces overtones based on the set of testing output signals Resp9. The second module 504 may be a processor, DSP, or a software application. The system 50 may include built-in firmware integrated with the first module 503 and the second module 504, such as DSP having the built-in firmware.

Figure 25:
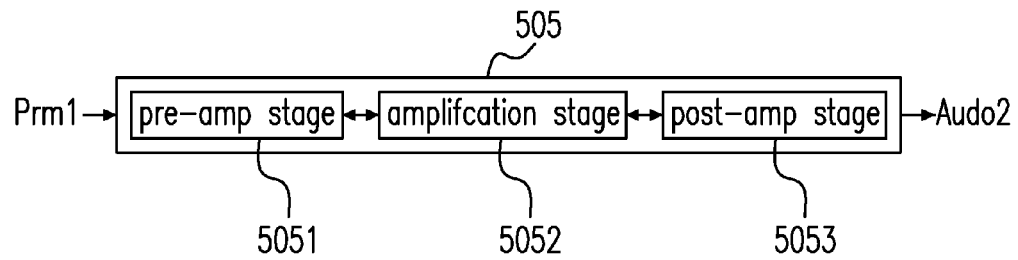
FIG. 25 shows the acoustic transducer according the preferred embodiment of the present disclosure.

Please refer to FIG. 25, which shows the acoustic transducer 505 according the preferred embodiment of the present disclosure. The acoustic transducer 505 includes a pre-amp stage 5051, an amplification stage 5052 and a post-amp stage 5053. The second module 504 obtains a first frequency response characteristic of the pre-amp stage 5051 by identifying occurrences when the musical instrument 502 produces overtones based on the second profile. The second profile is illustrated in FIG. 7, and the curve between the first area Ar1 and the second area Ar2 can determine the shape of the frequency response characteristic of the pre-amp stage 5051 as mentioned before. The set of parameters Prm1 comprises a first parameter identifying a first frequency response characteristic of the pre-amp stage 5051, a second parameter identifying a gain characteristic of the amplification stage 5052 and a third parameter identifying a second frequency response characteristic of the post-amp stage 5053. The first parameter models at least one of a first bass, a first midrange and a first treble band characteristics of the musical instrument and any combination thereof, and the third parameter models at least one of a second bass, a second midrange and a second treble band characteristics of the musical instrument and any combination thereof. Because a product of multiplying the first frequency response characteristic and the second frequency response characteristic is proportional to the first frequency response, the second frequency response characteristic is derived by dividing the first frequency response by the first frequency response characteristic as in equation (3). The amplitude of the frequency response characteristics of the pre-amp stage 5031 and the post-amp stage 5033 can be normalized when we are only concerned about the shape of the frequency response characteristics.

In FIG. 24, the system 50 further includes a storage device 506 coupled to the second module 504 to save the set of parameters Prm1 and a network module 507 coupled to the storage device 506 to uplink the set of parameters Prm1 to a cloud end 508. Although the audio signal Audo1 and the modified audio signal Audo2 are analyzed and synthesized by the second module 504 at the same end of a network, they can also be deal with separately at different ends of the network. For example, the storage device can be disk storage, or flash memory/memory card which is suitable for use in a computer, or mobile device.

Preferably, the interface 501, first module 503, second module 504, acoustic transducer 505, storage device 506, and network module 507 are all configured in a single electronic device, such as a computer, notebook, tablet computer, or smart phone. In this way, a user can easily build an acoustic transducer to model a musical instrument 502 by themselves, or even at any place when he/she has a mobile device. The electronic device may be connected or include a display coupled to the interface 501 and the display can be employed to visually (e.g., by graphical user interface (GUI)) help, teach or instruct the user how to easily use the modules 501 to 507 to complete a standard procedure for modeling the musical instrument 502.

Figure 26:
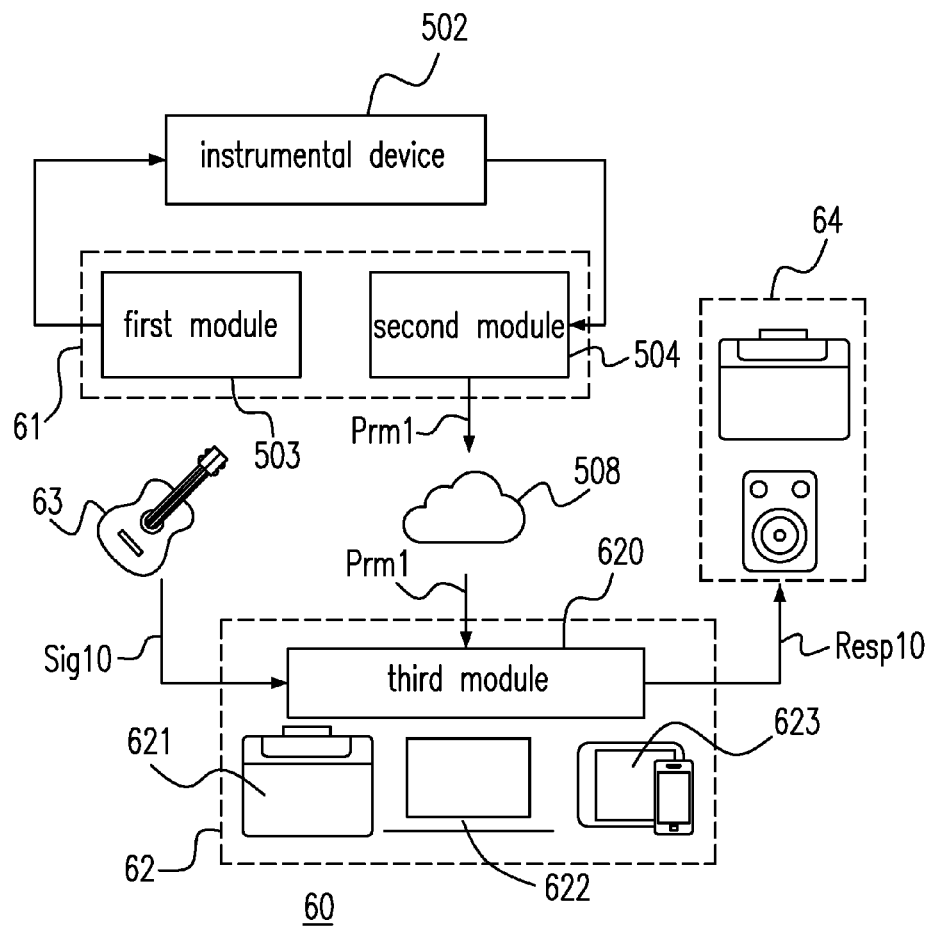
FIG. 26 shows a system analyzes and synthesizes the set of parameters by different host according to the preferred embodiment of the present disclosure.

Please refer to FIG. 26, which shows a system 60 that analyzes and synthesizes the set of parameters Prm1 through different hosts according to the preferred embodiment of the present disclosure. The system 60 comprises a first host 61, a second host 62, a sound generator 63, a speaker 64 and a cloud end 508. The first host 61 includes a first module 503 and a second module 504. The second host 62 includes a third module 620. The set of parameters Prim1 that modeling the characteristics of the musical instrument 502 are transmitted by the first host 61 over the cloud end 508, and are received by the third module 620 of the second host 62. The third module 620 can be implemented in a loudspeaker box 621, a personal computer 622 or a mobile device 623. The third module reconstructs the acoustic transducer 505 by obtaining, or accessing the set of parameters Prm1 at the opposite network end, that is, the third module 620 can produce almost the same sound effect as that of the musical instrument 502 at a remote end when the sound generator 63 inputs a sound signal Sig10 to the second host 62. The third module 620 can reconstruct the acoustic transducer 505 off-line (e.g., download or cache the set of parameters Prm1), on-line (e.g., manipulate the set of parameters Prm1 on a webpage with a GUI by connecting to the cloud), or in both ways. In addition, the third module 620 can be used to adjust or modify the set of parameters Prm1 to create a new timbre. For example, the third module 620 can modify the first parameter to enhance the first bass band characteristic, then output an output signal Resp10 to the speaker 64 to enhance lower pitch sounds.

EMBODIMENTS

1. A system for modifying an audio signal comprises an interface and a computer. The computer includes a first digital signal processor (DSP) and a network module. The first DSP includes a first module and a second module. The interface is configured to interact with an musical instrument. The first module is coupled to the interface to provide the musical instrument with a set of testing input signals and obtain a set of testing output signals from the musical instrument via the interface. The second module is configured to perform functions including: analyzing the set of testing output signals, in at least one of a time domain, frequency domain and a combination thereof, to obtain a set of parameters, constructing an acoustic transducer to model characteristics of the musical instrument based on the set of parameters, and receiving the audio signal to modify the audio signal using the acoustic transducer, wherein the first DSP module obtains the set of parameters at least by identifying occurrences when an output level state determined at least based on the set of testing output signals in at least one of the frequency domain and the time domain significantly changes. The network module is coupled to the first DSP module to uplink the set of parameters to a cloud end to share with a client end.

2. The system of embodiment 1, further comprising an input end, an output end, and a storage device. The input end is formed on the interface to receive at least one of the set of first testing output signals and the audio signal. The output end is formed on the interface to output at least one of the set of first testing input signals and the modified audio signal. The storage device coupled to the second module saves the set of parameters. The network module is coupled to the storage device to uplink the set of parameters to a cloud end.

3. The system as in any of embodiments 1-2, wherein the client end includes a second DSP module configured to perform functions including: synchronizing the characteristic of the musical instrument based on the set of parameters obtained from the cloud end, and receiving another audio signal to synthesize it. The acoustic transducer includes a pre-amp stage, an amplification stage and a post-amp stage. The first module inputs a first testing input signal into the musical instrument to obtain a first testing output signal, and the second module analyzes the first testing output signal to obtain a first profile. The first testing input signal is one of a white noise signal and a chirp signal generated from a chirp filter. The set of parameters comprises a first parameter identifying a first frequency response characteristic of the pre-amp stage, a second parameter identifying a gain characteristic of the amplification stage and a third parameter identifying a second frequency response characteristic of the post-amp stage. The first parameter models at least one of a first bass, a first midrange and a first treble band characteristics of the musical instrument, and the third parameter models at least one of a second bass, a second midrange and a second treble band characteristics of the musical instrument.

4. The system as in any of embodiments 1-3, wherein a product of multiplying the first frequency response characteristic and the second frequency response characteristic is proportional to the first frequency response. The first module inputs a second testing input signal to the musical instrument to obtain a second testing output signal, and the second module analyzes the second testing output signal to obtain a second profile, wherein the second testing input signal is one of a sweep signal and an amplitude modulation signal. The output level state is output levels in at least one specific frequency band of the second testing output signal. The second module obtains the first frequency response characteristic of the pre-amp stage based on the second profile by identifying occurrences when the output levels exceed a predetermined threshold to produce overtones. The second module obtains the first frequency response characteristic of the pre-amp stage by identifying occurrences when the musical instrument produces overtones based on the second profile. The second frequency response characteristic is derived by dividing the first frequency response by the first frequency response characteristic. The system is one of an audio amplifier, a speaker, and a combination thereof. The system includes built-in firmware integrated with the first module and the second module.

5. A system for modifying an audio signal comprises an interface and a mobile device. The mobile device includes a first digital signal processor (DSP) and a network module. The first DSP includes a first module and a second module. The interface is configured to interact with an musical instrument. The first module is coupled to the interface to provide the musical instrument with a set of testing input signals and obtain a set of testing output signals from the musical instrument via the interface. The second module is configured to perform functions including: analyzing the set of testing output signals, in at least one of a time domain, frequency domain and a combination thereof, to obtain a set of parameters, constructing an acoustic transducer to model characteristics of the musical instrument based on the set of parameters, and receiving the audio signal to modify the audio signal using the acoustic transducer, wherein the first DSP module obtains the set of parameters at least by identifying occurrences when an output level state determined at least based on the set of testing output signals in at least one of the frequency domain and the time domain significantly changes. The network module is coupled to the first DSP module to uplink the set of parameters to a cloud end to share with a client end.

6. The system of embodiment 5, wherein the client end includes a second DSP module configured to perform functions including; synchronizing the characteristics of the musical instrument based on the set of parameters obtained from the cloud end, and receiving another audio signal to synthesize it. The testing module feeds a first specific one of the testing input signals into the musical instrument to obtain a first specific one of the testing output signals, and the analyzing module analyzes the first specific output signal to obtain a first profile. The first specific testing input signal is one of a white noise signal and a chirp signal generated from a chirp filter, and the analyzing module models the characteristics by constructing at least a pre-amp stage and a post-amp stage based on the first profile.

7. The system as in any of embodiments 5-6, wherein the pre-amp stage has a first frequency response characteristic, the post-amp stage has a second frequency response characteristic, and the first profile represents a first frequency response. A product of the first frequency response characteristic and the second frequency response characteristic is proportional to the first frequency response.

8. The system as in any of embodiments 5-7, further comprising a synthesizing module including a pre-amp stage, wherein the testing module feeds a second specific one of the testing input signals into the musical instrument to obtain a second specific one of the testing output signals, and the analyzing module analyzes the second specific testing output signal to obtain a second profile. The second specific testing input signal is one of a sweep signal and an amplitude modulation signal. The output level state is output level change rates in at least one fundamental frequency band of the second specific testing input signal. The analyzing module obtains a first frequency response characteristic of the pre-amp stage based on the second profile by identifying occurrences when the output level change rates reduce below a predetermined threshold.

9. The system as in any of embodiments 5-8, further comprising a synthesizing module including a pre-amp stage, wherein the pre-amp stage has a first frequency response characteristic. The musical instrument has a reference impulse response characteristic. A result of convoluting each one of the testing input signals and the reference impulse response characteristic is equal to a resulting impulse response. The analyzing module converts the resulting impulse response to a resulting frequency response, wherein the resulting frequency response contains a corresponding one of the overtones when the resulting impulse response has an amplitude that falls into a non-linearity region of the musical instrument. The analyzing module models the first frequency response characteristic by identifying frequency points where the overtones occur when each input level of the corresponding testing input signals is large enough.

10. The system as in any of embodiments 5-9, wherein the testing input signals include a first sub-signal and a second sub-signal sequentially fed to the musical instrument. The first sub signal and the second sub signal have input levels of a similarly increasing rate. The first sub signal has a first constant frequency, and the second sub-signal has a second constant frequency, wherein the first constant frequency is lower than the second constant frequency.

11. The system as in any of embodiments 5-10, wherein the testing input signals include a first sub-signal and a second-sub signal sequentially fed into the musical instrument. The first sub signal and the second sub signal have frequencies of a similarly increasing rate. The first sub signal has a first constant input level, and the second sub-signal has a second constant input level, wherein the first constant input level is lower than the second constant input level.

12. A system for modifying an audio signal comprises an interface and a host. The host including a DSP module includes a first module and a second module. The first module is coupled to the interface to provide the musical instrument with a set of testing input signals and obtain a set of testing output signals from the musical instrument via the interface. The second module is configured to perform functions including: analyzing the set of testing output signals to obtain a set of parameters, constructing an acoustic transducer to model characteristics of the musical instrument based on the set of parameters and receiving the audio signal to modify the audio signal using the acoustic transducer, wherein the DSP module obtains the set of parameters at least by identifying occurrences when an output level state determined at least based on the set of testing output signals in at least one of a frequency domain and a time domain significantly changes.

13. The system of embodiment 12, wherein the host is at least one of a computer and a mobile device. The set of the output signals includes a first output signal. The first output signal includes a relatively low frequency band energy and a relatively high frequency band energy, and determines a breakup value when a first energy difference of the first output signal between the relatively low frequency band energy and the relatively high frequency band energy significantly changes. The set of the input signals includes a first input signal and a second input signal. The first input signal is a chirp signal having a first input level, and the first input level of the chirp signal increases until the energy difference decreases in order to identify the breakup value. The first module is configured to provide the musical instrument with the second input signal based on the breakup value and obtain a first profile from the musical instrument to model the characteristics.

14. The system as in any of embodiments 12-13, wherein the set of the input signals includes a first input signal and a second input signal. The first input signal is a chirp signal having a first input level, and the first output signal has an output level and an output level change rate in a specific frequency band. The first module increases the first input level of the chirp signal until one of the output level significantly changes to produce an overtone and the output level change rate significantly changes to identify a breakup value. The first module is further configured to generate one of a white signal and a chirp signal generated from a chirp filter. The second input signal is a composite signal generated by multiplying one of the white signal and the chirp signal by the breakup value in a time domain in order to maintain the musical instrument in a linearity region.

15. The system as in any of embodiments 12-14, wherein the second module models the characteristics by constructing at least a pre-amp stage and a post-amp stage based on the first profile. The pre-amp stage has a first frequency response characteristic, the post-amp stage has a second frequency response characteristic, and the first profile represents a first frequency response. A product of the first frequency response characteristic and the second frequency response characteristic is proportional to the first frequency response.

16. The system as in any of embodiments 12-15, wherein the first module provides a third input signal having input levels into the musical instrument to obtain a third output signal having output levels and output level change rates corresponding to the input levels in at least one specific frequency band, and the second module analyzes the third output signal to obtain a second profile. The second module obtains the first frequency response characteristic of the pre-amp stage based on the second profile by identifying occurrences when one of the output levels significantly change to produces overtones and the output level change rates significantly change. The first frequency response is divided by the first frequency response characteristic to obtain the second frequency response characteristic.

17. The system as in any of embodiments 12-16, wherein the second module further models the characteristics by constructing an amplification stage between the pre-amp stage and the post-amp stage. The amplification stage has a characteristic curve having a linear range and a non-linear range, wherein there are an upper limit and a lower limit between the linear range and the non-linear range and the linear range has a gain characteristic around a quasi working point.

18. The system as in any of embodiments 12-17, wherein the second module further constructs one of a finite impulse response (FIR) filter and an infinite impulse response (IIR) filter for each of the pre-amp and the post-amp stages based on a respective one of the first and second frequency response characteristics. The first module further provides a fourth input signal to the pre-amp, amplification, and post-amp stages to obtain a fourth output signal. The fourth input signal has a fourth input level and the fourth output signal includes a relatively low frequency band energy and a relatively high frequency band energy wherein there is a second energy difference between the relatively low frequency band energy and the relatively high frequency band energy. The second module determines the fourth input level when the second energy difference begins to decrease by adjusting the gain characteristic of the linear range.

19. The system as in any of embodiments 12-18, wherein the first module adjusts the fourth input level of the fourth input signal until the second module detects that an expression of the first energy difference is similar to that of the second energy difference to determine the gain characteristic of the linear range when the upper limit and the lower limit of the amplification stage are fixed. The fourth input signal is one of a chirp signal and a sweep signal.

20. The system of any of embodiments 12-19, wherein the second module is a synthesizer for synthesizing a fifth input signal from an external musical instrument comprising at least three stages, an input end and an output end. The at least three stages are serially connected and correspond to the pre-amp stage, the amplification stage and the post-amp stage as in any of embodiments 17-19. The input end receives the fifth input signal and feeds the fifth input signal to the at least three stages to obtain a synthesized input signal. The output end outputs the synthesized input signal.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A system for modifying an audio signal, comprising:
   an interface configured to interact with an musical instrument; and
   a computer including:

a first digital signal processor (DSP) including:
  a first module coupled to the interface to provide the musical instrument with a set of testing input signals and obtain a set of testing output signals from the musical instrument via the interface; and
  a second module configured to perform functions including:
    analyzing the set of testing output signals, in at least one of a time domain, frequency domain and a combination thereof, to obtain a set of parameters;
    constructing an acoustic transducer to model characteristics of the musical instrument based on the set of parameters; and
    receiving the audio signal to modify the audio signal using the acoustic transducer, wherein the first DSP module obtains the set of parameters at least by identifying occurrences when an output level state determined at least based on the set of testing output signals in at least one of the frequency domain and the time domain significantly changes; and
  a network module coupled to the first DSP module to uplink the set of parameters to a cloud end to share with a client end, wherein
    an input end on the interface to receive at least one of the set of first testing output signals and the audio signal; and
    an output end on the interface to output at least one of the set of first testing input signals and the modified audio signal.

2. The system of claim 1, further comprising:
a storage device coupled to the second module to save the set of parameters, wherein:
the network module coupled to the storage device to uplink the set of parameters to the cloud end.

3. The system of claim 1, wherein:
the client end includes a second DSP module configured to perform functions including:
  synchronizing the characteristics of the musical instrument based on the set of parameters obtained from the cloud end; and
  receiving another audio signal to synthesize it;
the acoustic transducer includes a pre-amp stage, an amplification stage and a post-amp stage;
the first module inputs a first testing input signal to the musical instrument to obtain a first testing output signal, and the second module analyzes the first testing output signal to obtain a first profile;
the first testing input signal is one of a white noise signal and a chirp signal generated from a chirp filter;
the set of parameters comprises a first parameter identifying a first frequency response characteristic of the pre-amp stage, a second parameter identifying a gain characteristic of the amplification stage and a third parameter identifying a second frequency response characteristic of the post-amp stage; and
the first parameter models at least one of a first bass, a first midrange and a first treble band characteristic of the musical instrument, and the third parameter models at least one of a second bass, a second midrange and a second treble band characteristic of the musical instrument.

4. The system of claim 3, wherein:
a product of multiplying the first frequency response characteristic and the second frequency response characteristic is proportional to the first frequency response;
the first module inputs a second testing input signal to the musical instrument to obtain a second testing output signal, and the second module analyzes the second testing output signal to obtain a second profile, wherein the second testing input signal is one of a sweep signal and an amplitude modulation signal;
the output level state is output levels in at least one specific frequency band of the second testing output signal;
the second module obtains the first frequency response characteristic of the pre-amp stage based on the second profile by identifying occurrences when the output levels exceed a predetermined threshold to produce overtones;
the second frequency response characteristic is derived by dividing the first frequency response by the first frequency response characteristic;
the system is one of an audio amplifier, a speaker, and a combination thereof; and
the system includes built-in firmware integrated with the first module and the second module.

5. A system for modifying an audio signal, comprising:
an interface configured to interact with an musical instrument; and
a mobile device including:
  a first digital signal processor (DSP) including:
    a first module coupled to the interface to provide the musical instrument with a set of testing input signals and obtain a set of testing output signals from the musical instrument via the interface; and:
    a second module configured to perform functions including:
      analyzing the set of testing output signals, in at least one of a time domain, frequency domain and a combination thereof, to obtain a set of parameters;
      constructing an acoustic transducer to model characteristics of the musical instrument based on the set of parameters; and
      receiving the audio signal to modify the audio signal using the acoustic transducer, wherein the first DSP module obtains the set of parameters at least by identifying occurrences when an output level state determined at least based on the set of testing output signals in at least one of the frequency domain and the time domain significantly changes; and a network module coupled to the first DSP module to uplink the set of parameters to a cloud end to share with a client end, wherein:
        the musical instrument has a reference impulse response characteristic;
        a result of convoluting each one of the testing input signals and the reference impulse response characteristic is equal to a resulting impulse response; and
        the second module converts the resulting impulse response to a resulting frequency response, wherein the resulting frequency response contains a corresponding one of the overtones when the resulting impulse response has an amplitude that falls into a non-linearity region of the musical instrument.

6. The system of claim 5, wherein:
the client end includes a second DSP module configured to perform functions including:

synchronizing the characteristics of the musical instrument based on the set of parameters obtained from the cloud end; and receiving another audio signal to synthesize it;

the first module is a testing module, and the second module is an analyzing module;

the testing module feeds a first specific one of the testing input signals into the musical instrument to obtain a first specific one of the testing output signals, and the analyzing module analyzes the first specific output signal to obtain a first profile; and the first specific testing input signal is one of a white noise signal and a chirp signal generated from a chirp filter, and the analyzing module models the characteristics by constructing at least a pre-amp stage and a post-amp stage based on the first profile.

7. The system of claim 6, wherein:

the pre-amp stage has a first frequency response characteristic, the post-amp stage has a second frequency response characteristic, and the first profile represents a first frequency response; and a product of the first frequency response characteristic and the second frequency response characteristic is proportional to the first frequency response.

8. The system of claim 5, further comprising a synthesizing module including a pre-amp stage, wherein:

the testing module feeds a second specific one of the testing input signals to the musical instrument to obtain a second specific one of the testing output signals, and the analyzing module analyzes the second specific testing output signal to obtain a second profile;

the second specific testing input signal is one of a sweep signal and an amplitude modulation signal;

the output level state is output level change rates in at least one fundamental frequency band of the second specific testing input signal; and the analyzing module obtains a first frequency response characteristic of the pre-amp stage based on the second profile by identifying occurrences when the output level change rates reduce below a predetermined threshold.

9. The system of claim 5, further comprising a synthesizing module including a pre-amp stage and, wherein:

the pre-amp stage has a first frequency response characteristic;

the analyzing module models the first frequency response characteristic by identifying frequency points where the overtones occur when each input level of the corresponding testing input signals is large enough.

10. The system of claim 5, wherein:

the testing input signals include a first sub-signal and a second sub-signal sequentially fed into the musical instrument;

the first sub signal and the second sub signal have input levels of a same increasing rate; and the first sub signal has a first constant frequency, and the second sub-signal has a second constant frequency, wherein the first constant frequency is lower than the second constant frequency.

11. The system of claim 5, wherein:

the testing input signals include a first sub-signal and a second-sub signal fed into the musical instrument sequentially;

the first sub signal and the second sub signal have frequencies of a same increasing rate; and the first sub signal has a first constant input level, and the second sub-signal has a second constant input level, wherein the first constant input level is lower than the second constant input level.

12. A system for modifying an audio signal, comprising:

an interface configured to interact with an musical instrument; and a host including a DSP module including:

a first module coupled to the interface to provide the musical instrument with a set of testing input signals and obtain a set of testing output signals from the musical instrument via the interface; and a second module configured to perform functions including:

analyzing the set of testing output signals to obtain a set of parameters;

constructing an acoustic transducer to model characteristics of the musical instrument based on the set of parameters; and receiving the audio signal to modify the audio signal using the acoustic transducer, wherein the DSP module obtains the set of parameters at least by identifying occurrences when an output level state determined at least based on the set of testing output signals in at least one of a frequency domain and a time domain significantly changes, wherein:

the first output signal includes at least a relatively low frequency band energy and at least a relatively high frequency band energy, and determines a breakup value when a first energy difference of the first output signal between the relatively low frequency band energy and the relatively high frequency band energy significantly changes.

13. The system of claim 12, wherein:

the host is at least one of a computer and a mobile device;

the set of output signals includes a first output signal;

the set of input signals includes a first input signal and a second input signal;

the first input signal is a chirp signal having a first input level, and the first input level of the chirp signal increases until the energy difference decreases in order to identify the breakup value; and the first module is configured to provide the musical instrument with the second input signal based on the breakup value and obtain a first profile from the musical instrument to model the characteristics.

14. The system of claim 12, wherein:

the set of the input signals includes a first input signal and a second input signal;

the first input signal is a chirp signal having a first input level, and the first output signal has an output level and an output level change rate in a specific frequency band;

the first module increases the first input level of the chirp signal until one of the output level significantly changes to produce an overtone and the output level change rate significantly changes to identify a breakup value;

the first module is further configured to generate one of a white signal and a chirp signal generated from a chirp filter; and the second input signal is a composite signal generated by multiplying one of the white signal and the chirp signal by the breakup value in a time domain in order to maintain the musical instrument in a linearity region.

15. The system of claim 12, wherein:

the second module models the characteristics by constructing at least a pre-amp stage and a post-amp stage based on the first profile; and the pre-amp stage has a first frequency response characteristic, the post-amp stage has a second frequency response characteristic, and the first profile represents a first frequency response;

a product of the first frequency response characteristic and the second frequency response characteristic is proportional to the first frequency response.

16. The system of claim 15, wherein:

the first module provides a third input signal having input levels into the musical instrument to obtain a third output signal having output levels and output level change rates corresponding to the input levels in at least one specific frequency band, and the second module analyzes the third output signal to obtain a second profile;

the second module obtains the first frequency response characteristic of the pre-amp stage based on the second profile by identifying occurrences when one of the output levels significantly change to produces overtones and the output level change rates significantly change; and the first frequency response is divided by the first frequency response characteristic to obtain the second frequency response characteristic.

17. The system of claim 16, wherein:

the second module further models the characteristics by constructing an amplification stage between the pre-amp stage and the post-amp stage; and the amplification stage has a characteristic curve having a linear range and a non-linear range, wherein there is an upper limit and a lower limit between the linear range and the non-linear range and the linear range has a gain characteristic around a quasi working point.

18. The system of claim 17, wherein:

the second module further constructs one of a finite impulse response (FIR) filter and an infinite impulse response (IIR) filter for each of the pre-amp and the post-amp stages based on a respective one of the first and second frequency response characteristics;

the first module further provides a fourth input signal to the pre-amp, amplification, and post-amp stages to obtain a fourth output signal;

the fourth input signal has a fourth input level and the fourth output signal includes a relatively low frequency band energy and a relatively high frequency band energy wherein there is a second energy difference between the relatively low frequency band energy and the relatively high frequency band energy; and the second module determines the fourth input level when the second energy difference begins to decrease by adjusting the gain characteristic of the linear range.

19. The system of claim 18, wherein:

the first module adjusts the fourth input level of the fourth input signal until the third module detects that an expression of the first energy difference is similar to that of the second energy difference to determine the gain characteristic of the linear range when the upper limit and the lower limit of the amplification stage are fixed; and the fourth input signal is one of a chirp signal and a sweep signal.

20. The system of claim 18, wherein:

the modeler is a synthesizer for synthesizing a fifth input signal from an external musical instrument comprising:

at least three stages serially connected and corresponding to the pre-amp stage, the amplification stage and the post-amp stage as in claim 17;

an input end receiving the fifth input signal and feeding the fifth input signal to the at least three stages to obtain a synthesized input signal; and an output end outputting the synthesized input signal.

* * * * *